US009584889B2

(12) United States Patent
Escher-Poeppel et al.

(10) Patent No.: US 9,584,889 B2
(45) Date of Patent: Feb. 28, 2017

(54) SYSTEM AND METHOD FOR PACKAGED MEMS DEVICE HAVING EMBEDDING ARRANGEMENT, MEMS DIE, AND GRILLE

(71) Applicant: Infineon Technologies AG, Neubiberg (DE)

(72) Inventors: Irmgard Escher-Poeppel, Duggendorf (DE); Edward Fuergut, Dasing (DE); Alfons Dehe, Reutlingen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/011,566

(22) Filed: Aug. 27, 2013

(65) Prior Publication Data

US 2015/0061048 A1 Mar. 5, 2015

(51) Int. Cl.

*H01L 29/84* (2006.01)
*H04R 1/02* (2006.01)
*H04R 19/00* (2006.01)
*H04R 31/00* (2006.01)
*H04R 1/08* (2006.01)

(52) U.S. Cl.

CPC ........... *H04R 1/021* (2013.01); *H04R 19/005* (2013.01); *H04R 31/006* (2013.01); *H04R 1/086* (2013.01); *H04R 2201/003* (2013.01); *H04R 2201/02* (2013.01); *H04R 2231/003* (2013.01)

(58) Field of Classification Search

CPC ..... H04R 1/021; H04R 19/005; H04R 31/006
See application file for complete search history.

(56) References Cited

U.S. PATENT DOCUMENTS 7,550,828 B2 6/2009 Ramakrishna et al.
7,763,488 B2 7/2010 Goodelle et al.
(Continued)

FOREIGN PATENT DOCUMENTS

CN 102134054 A 7/2011
KR 20080109001 A 12/2008
KR 20090033843 A 4/2009

OTHER PUBLICATIONS

Braun, T., et al., "3D Stacking Approaches for Mold Embedded Packages," Microelectronics and Packaging Conference (EMPC), 2011 18th European, Sep. 12-15, 2011, 9 pages.
(Continued)

*Primary Examiner* — Stephen W Smoot
*Assistant Examiner* — Vicki B Booker
(74) *Attorney, Agent, or Firm* — Slater Matsil, LLP

(57) ABSTRACT

A packaged MEMS device may include an embedding arrangement, a MEMS device disposed in the embedding arrangement, a sound port disposed in the embedding arrangement and acoustically coupled to the MEMS device, and a grille within the sound port. Some embodiments relate to a sound transducer component including an embedding material and a substrate-stripped MEMS die embedded into the embedding material. The MEMS die may include a diaphragm for sound transduction. The sound transducer component may further include a sound port within the embedding material in fluidic or acoustic contact with the diaphragm. Further embodiments relate to a method for packaging a MEMS device or to a method for manufacturing a sound transducer component.

23 Claims, 34 Drawing Sheets

(56) References Cited

U.S. PATENT DOCUMENTS

| | | | | |
|---|---|---|---|---|
| 8,030,112 | B2 | 10/2011 | Hsieh et al. | |
| 8,188,557 | B2 | 5/2012 | Rombach et al. | |
| 2008/0083957 | A1* | 4/2008 | Wei | B81B 7/0064 257/415 |
| 2012/0237073 | A1* | 9/2012 | Goida et al. | 381/361 |

OTHER PUBLICATIONS

Braun, T., et al., "Potential of Large Area Mold Embedded Packages With PCB Based Redistribution," SMTA (Surface Mount Technology Association), IWLPC (Wafer-Level Packaging) Conference, Oct. 3, 2011, 8 pages.

* cited by examiner

SYSTEM AND METHOD FOR PACKAGED MEMS DEVICE HAVING EMBEDDING ARRANGEMENT, MEMS DIE, AND GRILLE

TECHNICAL FIELD

Embodiments relate to a packaged MEMS device. Some embodiments relate to a sound transducer component. Some embodiments relate to a method for packaging a MEMS die. Some embodiments relate to a method for manufacturing a sound transducer component.

BACKGROUND

In the technical field of electronic devices and microelectromechanical systems (MEMS), there is a trend towards miniaturization and heterogeneous system integration. Among others, the desire for miniaturization and heterogeneous system integration calls for new packaging technologies which also allow large area processing and 3D integration with potential for low-cost applications. Two major packaging trends in this area are thin film technique and the so called Chip-in-Substrate Package technique (CiSP).

Typically, the main functions of a chip package may be to attach a semiconductor chip or semiconductor die at a printed circuit board (PCB) and to electrically connect the integrated circuit that is implemented on the semiconductor chip/die with the circuit(s) that is/are present on the printed circuit board. The chip may be arranged on an interposer. Furthermore, the package may provide protection for the die against damage and environmental influences (dirt, moisture, etc.).

SUMMARY OF THE INVENTION

A packaged MEMS device is provided that comprises an embedding arrangement, a MEMS device disposed in the embedding arrangement, a sound port disposed in the embedding arrangement and acoustically coupled to the MEMS device, and a grille disposed in the sound port.

According to further embodiments, a packaged MEMS device is provided that comprises an embedding arrangement, a MEMS device disposed in the embedding arrangement, a sound port embedded in the embedding arrangement, and a grille disposed across the sound port. The sound port is acoustically coupled to the MEMS device.

Further embodiments provide a packaged MEMS device that comprises an embedding arrangement, a MEMS device disposed in the embedding arrangement, an opening disposed in the embedding arrangement, and a grille within the opening. The opening is adjacent to the MEMS device.

According to further embodiments, a sound transducer component is provided that comprises an embedding material and a substrate-stripped MEMS die embedded into the embedding material. The MEMS die may comprise a diaphragm for sound transduction. The sound transducer component may further comprise a sound port within the embedding material in fluidic (e.g., acoustic) contact with the diaphragm.

A method for packaging a MEMS device is provided. The method comprises embedding a precursor MEMS die in an embedding arrangement to obtain an embedded precursor MEMS die. The method further comprises creating a grille at a surface of the embedded precursor MEMS die. The method also comprises removing an auxiliary portion of the embedded precursor MEMS die adjacent to the grille to create a sound port within the embedding arrangement.

A method for manufacturing a sound transducer component or a plurality of sound transducer components is provided. The method comprises creating a plurality of spacers at a surface of a wafer comprising a plurality of precursor MEMS dies. Each spacer covers at least a portion of a diaphragm of a corresponding precursor MEMS die. The method also comprises singulating the wafer to obtain a plurality of singulated precursor MEMS dies. The method further comprises embedding a selected number of the plurality of singulated precursor MEMS dies together with the spacers in an embedding arrangement to form a reconstitution wafer. The method comprises removing the plurality of spacers to obtain a plurality of sound ports within the embedding arrangement. The method further comprises singulating the reconstitution wafer, thereby forming or obtaining the sound transducer component(s).

BRIEF DESCRIPTION OF THE DRAWINGS

Embodiments of the present invention are described herein making reference to the appended drawings.

DETAILED DESCRIPTION OF ILLUSTRATIVE EMBODIMENTS

In the following description, a plurality of details are set forth to provide a more thorough explanation of embodiments of the present invention. However, it will be apparent to those skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

The present invention will be described with respect to implementation examples in a specific context, namely an embedded MEMS microphone manufactured in a chip embedding process. Embodiments of the invention may also be applied, however, to other MEMS devices, sensors or transducers and to other packaging processes.

Figure 1:
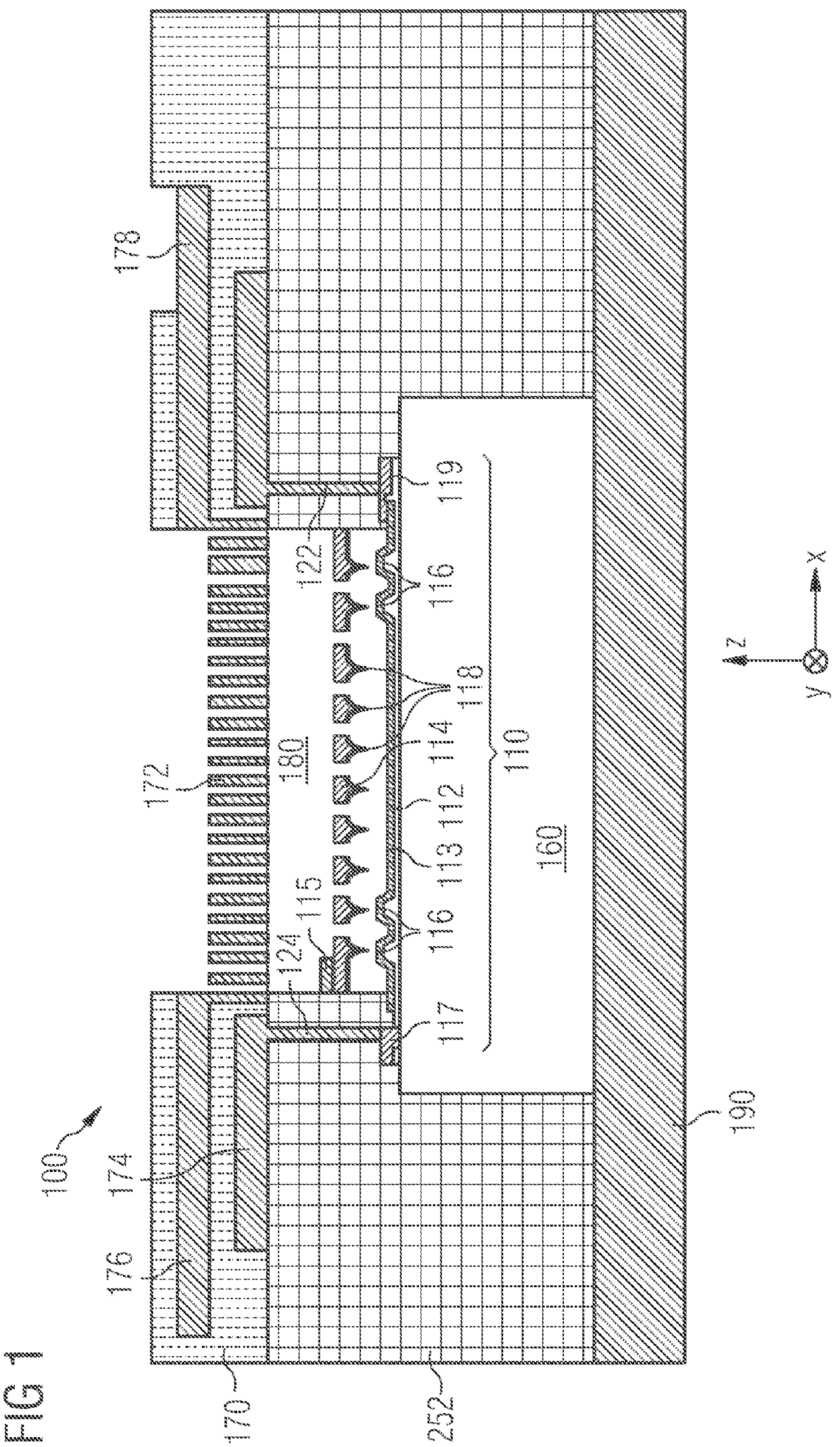
FIG. 1 shows a schematic cross-section of a sound transducer component.

FIG. 1 shows a schematic cross-section of a sound transducer component 100 according to a first possible example of implementation. The sound transducer component 100 may be a packaged MEMS device and comprise a MEMS die 110 comprising a diaphragm 112. The MEMS die 110 may be a MEMS device or a part of a MEMS device. The sound transducer component may further comprise an embedding material 252 (also referred to as "main embedding part" for some implementation examples) into which the MEMS die 110 may be embedded, i.e., the MEMS die may be disposed in the embedding arrangement. For example, the MEMS die 110 may be embedded by molding in the embedding material 252. A cavity 160 may be formed within the embedding material 252. The cavity 160 may contact the diaphragm 112. The cavity 160 may be in fluidic and/or acoustic contact with the diaphragm 112, i.e., a fluid within the cavity 160 such as air or a gas or a sound wave can reach the diaphragm 112 via fluidic movement or sound propagation. The fluidic movement may occur through a perforated backplate, a grille, or another similar structure that provides a fluidic and/or acoustic communication between the cavity 160 and a volume of fluid that is directly adjacent to the diaphragm 112. More generally, the cavity 160 may be in contact or directly adjacent to a sound transducing region of the sound transducer component 100. The sound transducing region may typically comprise at least a diaphragm. Furthermore, the sound transducing region may comprise one or more backplate(s) as a counterelectrode for a capacitive sound transducer. In the alternative, the sound transducer component may comprise, for example, a piezoelectric element for transducing a deflection or displacement of the diaphragm into an electrical signal. In some embodiments, the diaphragm 112 may be implemented as a membrane. The embedding material (encapsulation material) 252 may be or may comprise a molded compound part or a mold compound. The embedding material may be or may comprise plastic or resin.

In the example of a possible implementation schematically illustrated in FIG. 1, the MEMS die 110 may comprise a backplate 114. The diaphragm 112 and the backplate 114 may be arranged substantially parallel to each other with a gap 113 being interposed between them. The diaphragm 112 may comprise corrugations 116 that may be configured to facilitate a deflection/displacement of the diaphragm 112. In particular, the corrugations 116 may serve to provide a substantially parallel displacement of a central portion of the diaphragm 112 in response to a sound wave impinging on the diaphragm 112 and causing the diaphragm 112 to displace. The backplate 114 may comprise a plurality of anti-sticking bumps 118 that may be configured to prevent that the backplate 114 and the diaphragm 112 adhere to each other in a substantially permanent manner which might make the sound transducer component 100 unusable. In the example shown in FIG. 1 the backplate 114 may be arranged at a side of the diaphragm 112 that may be opposite to the cavity 160. In alternative examples of implementation the positions of the backplate 114 and the diaphragm 112 could be inversed. The backplate 114 may be perforated and comprise a plurality of holes that allow an arriving sound wave to reach the diaphragm 112. The diaphragm 112 may also comprise a hole to facilitate an equalization of the static pressures in the cavity 160 and a transducer opening or sound port 180, which may be disposed at the opposite side of the diaphragm 112 than the cavity 160. The sound port 180 may be acoustically coupled to the MEMS device.

The MEMS die 110 may further comprise at least one of the following: a support structure (not explicitly shown in FIG. 1), a dielectric spacer element (not explicitly shown in FIG. 1) between the diaphragm 112 and the backplate 114, and electrical connections 115, 117, 119 that may be configured to provide an electrical contact for the diaphragm 112 and the backplate 114.

The embedding material 252 may comprises electrical through contacts or "vias" 122 and 124. The embedding material or main embedding part 252 may comprise a main surface at which a cover layer 170 may be disposed. The cover layer 170 may comprise a first redistribution layer or first metallization layer 174. The first metallization layer 174 may be configured to electrically contact the through contacts 122, 124 within the embedding material 252 and hence the contact pads 119, 117 of the MEMS die 110. In the example schematically illustrated in FIG. 1 the sound transducer component 100 may further comprise a grille or grid 172 disposed in or across the sound port 180. The grille 172 may be configured to provide a mechanical protection and/or a protection against dirt, dust, etc. for the MEMS die 110 while allowing a sound wave to reach the diaphragm 112 of the MEMS die via the sound port 180. As schematically illustrated in FIG. 1, the grille 172 may further fulfill a function of electromagnetic interference shielding. To this end, the grille 172 may be electrically connected to a second metallization layer or redistribution layer 176 that is also disposed within the cover layer 170. The first redistribution layer 174 may be an underlying redistribution layer relative to the second redistribution layer 176. A contact pad 178 may be electrically connected to the grille 172 via the second metallization layer 176. The second metallization layer 176 may provide at least one of the following functionalities: shielding of interconnect to ASIC (not shown), shielding of underlying redistribution layer(s), mechanical protection of MEMS layers against particles or touching, and/or potential acoustical low pass filtering of audio band in conjunction with the resulting front cavity.

Upon the integration of the sound transducer component 100 into a more complex system such as a mobile phone, a smart phone, a digital camera, a digital camcorder, etc., the contact pad 178 may be connected to a mass (electrical ground) of the surrounding system. In this manner, the grille 172 may be kept at a substantially constant, well defined electrical potential. The grille 172 may comprise a plurality of holes, wherein the holes may have a round cross section, a square cross section, a rectangular cross section, an elongate cross section, a hexagonal cross section, a honeycomb arrangement etc.

The sound transducer component 100 may further comprise a backside cover 190 configured to close the cavity 160. The embedding material 252, the cover layer 170, and the backside cover 190 may be part of a package or embedding arrangement for the MEMS die 110.

According to some embodiments, a cross-section of the cavity 160 may be substantially equal to a surface of the MEMS die 110. The cross-section of the cavity 160 is here the cross-section along a section plane parallel to a main surface of the MEMS die 110, i.e., substantially parallel to the XY-plane as indicated by the coordinate system in FIG. 1. In other words, a bottom of the cavity 160 may be substantially completely formed by the MEMS die 110. This feature may result from the fact that the MEMS die 110 as it is present in the finished sound transducer component 100 is a substrate-free (substrate-stripped) MEMS die. A substrate which was originally part of the MEMS die 110 prior to the packaging process may be removed during the course of the packaging process, as its function of providing mechanical stability for the MEMS die 110 during manufacture (in particular during front end processing) can eventually be performed by the embedding material 252. The MEMS die 110 may be embedded by molding into the embedding material 252. According to alternative embodiments it is also possible, that only a portion of the original substrate is removed during the packaging process to form the cavity 160.

Although not shown in FIG. 1, the sound transducer component (MEMS device) 100 may further comprise a further die. The further die may be, for example, embedded (e.g., by molding) into the embedding material 252. The further die may be, for example, an ASIC (application-specific integrated circuit) that may be used to provide, e.g., a power supply for the sound transducer portion (in particular diaphragm 112 and backplate 114) and/or read-out functionality for providing an electrical signal that corresponds to the sound wave received by the sound transducer component 100. For example, the ASIC may be configured to perform an amplification and/or analog-to-digital conversion. At least one of the redistribution layers 174 and 176 may be configured to provide an electrical connection between the MEMS die 110 and the further die (e.g., ASIC). In this context it is noted that the terms "first redistribution/metallization layer" and "second redistribution/metallization layer" are not to be construed as implying a certain stacking order within the cover layer 170. In case the cover layer 170 comprises two or more redistribution/metallization layers, at least one of the redistribution layers (typically the uppermost or outermost redistribution layer) may serve as a shield regarding electromagnetic interference (EMI) for the underlying redistribution layer(s). The grille 172 may be electrically conductive, at least in part. When being connected to said redistribution layer that is dedicated for EMI shielding or another EMI-dedicated redistribution layer, the grille 172 may provide EMI shielding for electrical connections between the MEMS die and the further die (e.g., ASIC) and/or for the sound transducing portion of the MEMS die 110, i.e., the diaphragm 112 and the backplate 114, for example.

The sound port 180 may extend within the embedding material 252 at an opposite surface of the diaphragm 112 than the cavity 160 from the diaphragm 112. The sound port 180 may extend to an exterior surface of the sound transducer component and hence to a surrounding environment of the packed MEMS device. The grille 172 may be mechanically supported either by the embedding material 252 or by the cover layer 170. The sound port 180 may also extend through the cover layer 170. In other words, the packaged MEMS device 100 may comprise the MEMS device 110 and the sound port 180 which is adjacent to the MEMS device 110. The packaged MEMS device 100 may further comprise the embedding arrangement that embeds the MEMS device 110 and the sound port 180. The embedding arrangement may comprises the embedding material 252 and optionally also the cover layer 170. The packaged MEMS device may further comprise the grille 172 within the sound port 180.

FIG. 1 may also be understood as schematically depicting a sound transducer component 100 that may comprise an embedding material 252, a substrate-stripped MEMS die 110, and a sound port 180 within the embedding material 252. The substrate-stripped MEMS die 110 may be embedded within into the embedding material 252 and may comprise a diaphragm for sound transduction. The sound port 180 may be in fluidic and/or acoustic contact (fluidically and/or acoustically coupled) with the diaphragm. Hence, the sound port 180 may extend within the embedding material 252 as opposed to the substrate-stripped MEMS die being disposed directly at a surface of the embedding material 252 (i.e., the substrate-stripped MEMS die 110 being substantially flush with one of the exterior surfaces of the embedding material 252). In other words, the substrate-stripped MEMS die 110 may be somewhat recessed with respect to said exterior surface of the embedding material.

The back cover 190 may also be called a cavity cover configured to cover the cavity 160.

Silicon microphones or MEMS microphones typically need packaging to provide at least one of the following functionalities:

- mechanical protection of the MEMS part
- providing an acoustical sound port
- providing an acoustical reference volume
- housing an ASIC for read-out
- EMI shielding
- mechanical and electrical interconnect to the second level printed circuit board (PCB).

It is typically desired that the desired functions should be integrated in a minimum volume for advantageous application into, e.g., slim smartphones.

Regarding packing technologies for semiconductor devices a relatively new technology is "Wafer Level Packaging." Compared to previous packaging technologies, wafer level packaging may provide advantages in flexibility (mostly in terms of the semiconductor manufacturing and/or packaging processes), cost, and performance. Wafer Level Packaging may be used to provide multi-die packages, i.e., packages comprising a plurality of (individual) dies. The individual dies may be similar or homogeneous to each other or they may be heterogeneous, such as a MEMS die and an ASIC as a second die. The ASIC may comprise electronic circuits that may be used for operating the MEMS die. In this manner, different dies produced by different, dedicated semiconductor manufacturing (e.g., a dedicated MEMS process comprising sacrificial material handling for the MEMS die, and e.g., a CMOS process for the ASIC) processes may be combined in a single package.

According to the wafer level package technology which are built on the silicon wafer, the interconnects may fit on the chip (so-called fan-in design). In a first step, dicing of a front-end-processed wafer may be performed and subsequently the singulated chips may be placed on a carrier. The chips can be placed on the carrier at a distance that can be chosen relatively freely. Typically the distance of the chips may be larger than the original distance of the chips on the original silicon wafer. A casting compound may now be used to fill the gaps and the edges around the chips in order to form the artificial wafer (reconstitution wafer). After curing, the artificial wafer may contain a mold frame around the dies and may be configured to carry additional interconnect elements, due to a "fan-out" that may result from placing the chips at a greater distance than they were originally present on the original silicon wafer. The term "reconstitution" refers to the built of the artificial wafer. Subsequent to the reconstitution, the chip pads can be electrically connected to the interconnects using, for example, thin-film technology.

While the possibility to increase the number of interconnects may be of particular interest for complex electronic semiconductor devices such as microprocessors, microcontrollers, analog-to-digital converters, digital-to-analog converters, etc. that typically require a large number of interconnects, the wafer level package technology may also provide new horizons for MEMS devices, such as sound transducers. When applying the package solutions according to wafer level package to MEMS sound transducers, it is possible to achieve a near chip scale integration, i.e., a small and thin volume of the packaged sound transducer component can be achieved. The cavity 160 that is needed in some sound transducer designs can be performed in an alternative manner and in some embodiments the cavity etch during front-end processing can even be omitted altogether. This avoids expensive etching technologies during the front-end-process, such as deep reactive ion etching processes (DRIE). The wafer level package solution proposed herein may also provide shielding, such as EMI shielding, as well as additional mechanical protection. In some embodiments to be described below, the wafer level package-based solution, or a part thereof, may even be a part of the sensor, i.e., of the sound transducing structure which, in the case of a capacitive sound transducer, typically comprises a diaphragm and a backplate (counter electrode).

The MEMS chip or MEMS die may be molded into the package and finally the back cavity may be realized by, e.g., wet chemical removal of the bulk silicon or at least a portion of the bulk silicon. As an additional aspect a (second) metallization layer may be used for EMI shielding of the critical interconnect between ASIC and the sensor (MEMS die). The (second) metallization layer can also be used for mechanical protection of the MEMS part (e.g., particle protection). Alternatively, the (second) metallization layer can also be used directly as a backplate (counter electrode).

In the following description some possible implementations are described with reference to the corresponding figures. FIGS. 2A to 2H schematically illustrate a process flow according to an implementation with an oxide sacrificial layer. FIGS. 3A to 3K schematically illustrate a process flow according to an implementation wherein a sound port is formed within a cover layer that is part of the package. FIGS. 4A to 4G schematically illustrate a process flow for an implementation with a carbon sacrificial layer. FIGS. 5A to 5F show the possible implementations where the package or more precisely a component of the package is used as a functional part of the MEMS structure.

Figure 2A:
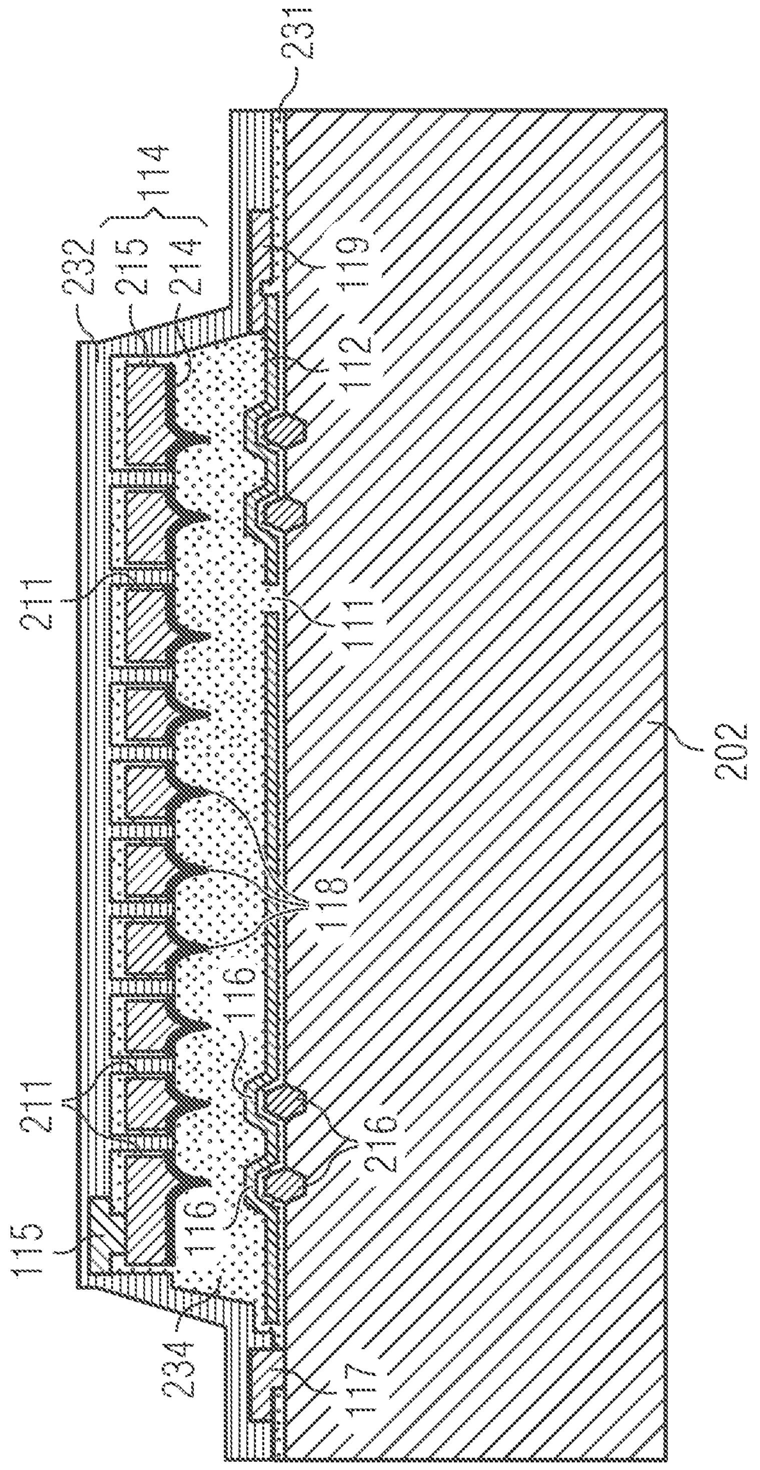
FIGS. 2A to 2H show schematic cross sections of process steps of a method for packaging a MEMS device of, e.g., a sound transducer component, wherein an oxide is used as a sacrificial layer.

FIG. 2A shows a schematic cross-section of a precursor MEMS die 210 as it may be output from a front-end-process and prior to a packaging process. The precursor MEMS die 210 comprises a substrate 202 and the actual MEMS structure which is disposed at a main surface of the substrate 202. The substrate 202 and almost the entire MEMS structure may be separated from each other by an etch stop layer 231 which may be a silicon oxide, a silicon nitride, or may comprise a silicon oxide, a silicon nitride, or any other suitable material. At the surface of the substrate 202, small islands 216 may be provided that are used during the formation of the corrugations 116 of the diaphragm 112. The eventual gap 113 (see FIG. 1) between the diaphragm 112 and the backplate 114 is still filled with a sacrificial material 234 such as an oxide, for example silicon oxide. The diaphragm 112 may further comprise a ventilation hole 111 for static pressure equalization as explained above. The sacrificial material 234 may also extend around the backplate 114 and within the holes 211 that are formed within the backplate. The sacrificial material 234 may be identical to the material of the etch stop layer 231, but this is not necessarily so.

As to the electrical contacts it can now in FIG. 2A be seen in more detail that, according to the depicted embodiment, contact 117 is configured to contact the substrate 202, electrical contact 119 is configured to contact the diaphragm 112, and contact 115 is configured to electrically contact the backplate 114. Different arrangements of the electrical contacts 115, 117, and 119 are also possible.

The backplate 114 may comprise two layers: an electrically conductive layer 215 and a second layer 214. The electrically conductive layer may comprise polysilicon, for example. The second layer 214 may comprise, for example, $Si_3N_4$, and may provide a base layer for polysilicon deposition and/or function as a diffusion barrier for the doping material of polysilicon (P-implantation). In addition or as an alternative, the second layer 214 may provide tensional stress, additional mechanical stability, and/or further electrical isolation.

The MEMS die 210 may further comprise a passivation layer 232. The passivation layer 232 may be a SiON passivation with a thickness of approximately 400 nm, for example. In general, the passivation layer 232 may have a thickness for example in the range from about 200 nm to about 700 nm. The passivation layer 232 may cover the entire upper surface of the MEMS die 210.

Figure 2B:
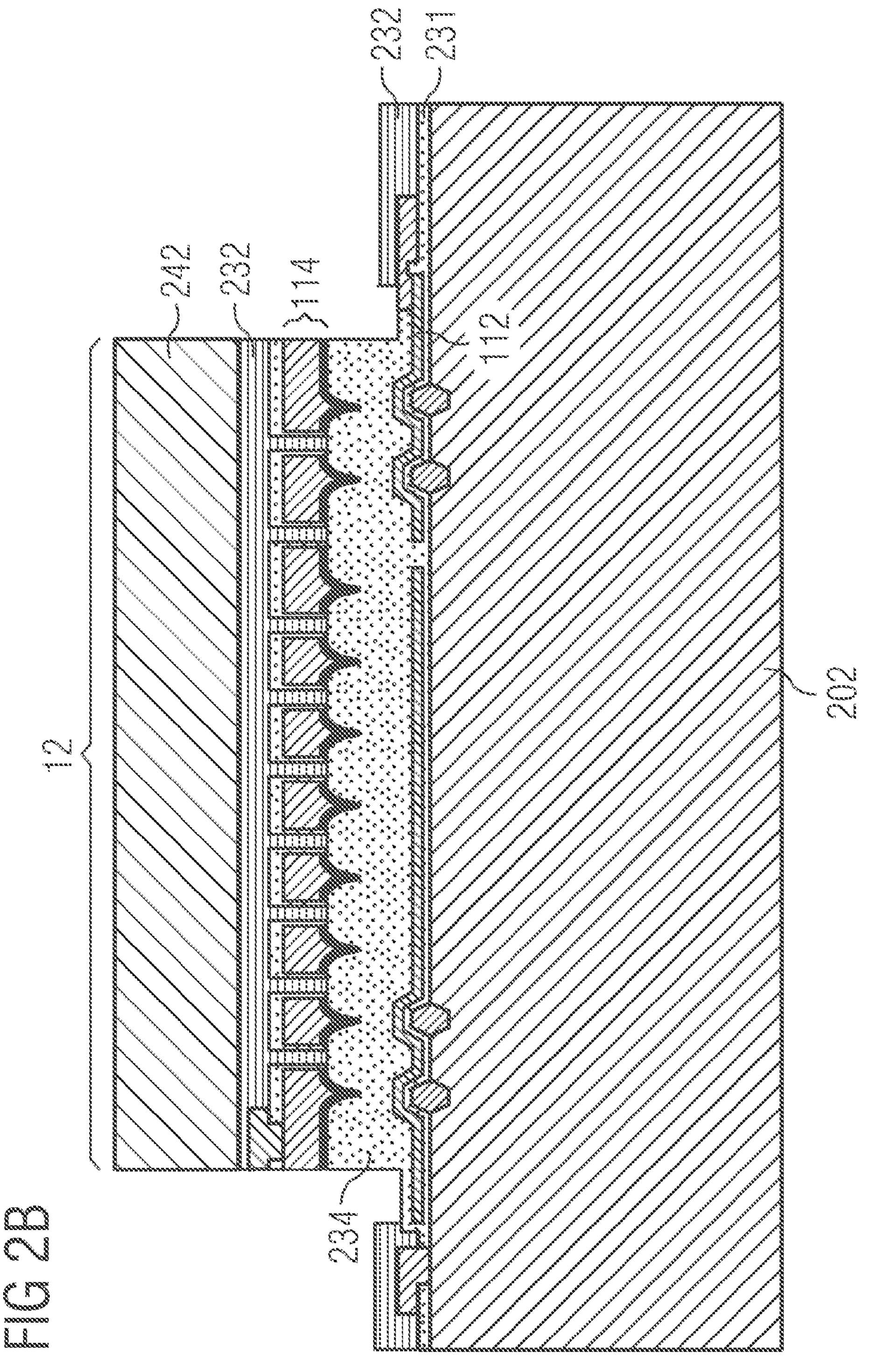

FIG. 2B shows a schematic cross-section of the prepackaging or precursor MEMS die 210 after an auxiliary layer 242 has been deposited on the passivation layer 232. The auxiliary layer 242 has also undergone a planarization and a structuring so that the auxiliary layer 242 is present within a footprint area 12 of the sound transducing structure, only. Around the footprint area 12 the passivation layer 232 and the auxiliary structure 242 have been removed. Furthermore, also a margin of the sacrificial material 234 has been removed as far as it extended beyond the footprint area 12. This removal may have been performed during the front-end-process and achieved by, for example, ion etching or another suitable semiconductor manufacturing technique. The backplate 114 and the layers 232, 242 that are deposited on an upper surface of the backplate 114 are temporarily supported by the sacrificial material 234, only. It is however possible to maintain at least a portion of a support structure such as a dielectric spacer between the diaphragm 112 and the backplate 114 at least at one or more positions along a circumference of the sound transducer structure/footprint area 12. The auxiliary structure 242 may comprise phosphosilicate glass (PSG) and the thickness of the deposited auxiliary structure 242 may be between about 6 μm and about 30 μm, more specifically between 8 μm and 20 μm, for example about 12 μm. The deposition, planarization and structuring of the PSG layer 242 is however optional. The SiON passivation layer 232 alone would also do.

Figure 2C:
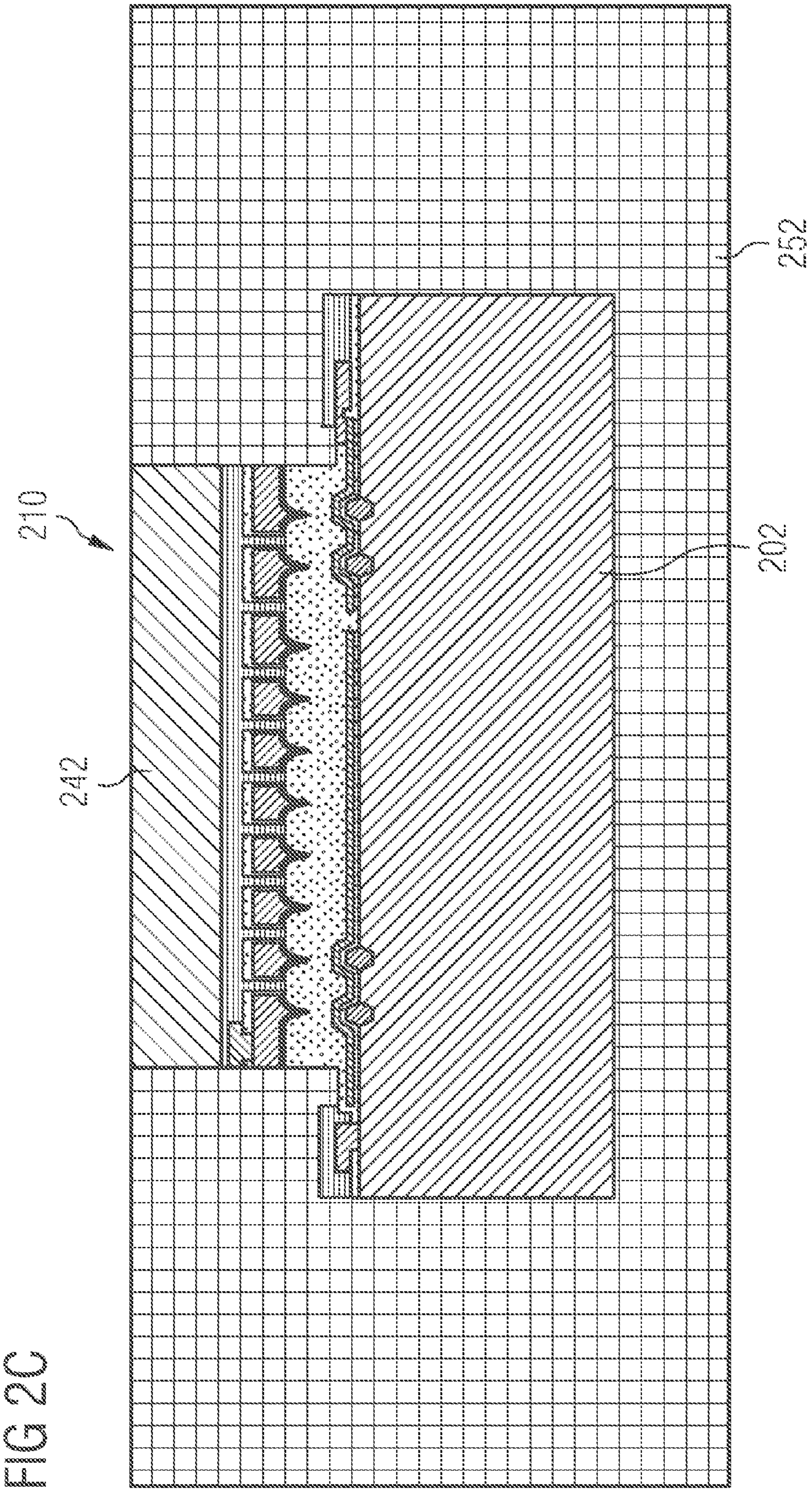

FIG. 2C shows a schematic cross-section of the precursor MEMS die 210 having the deposited, planarized, and/or structured auxiliary structure 242 after it has been embedded into an embedding material 252, for example by molding. While in the preceding FIG. 2B the precursor MEMS die 210 may typically be still provided on the original silicon wafer, along with a plurality of similar MEMS dies as output by the front-end-process, a chip singulation may have been performed between FIGS. 2B and 2C. According to at least some embodiments, a certain number of the precursor MEMS dies 210 may be arranged on a carrier having the size and the shape of a standard silicon wafer. The distance at which the individual MEMS dies 210 are placed may be larger than the distance at which they were spaced on the original silicon wafer so that a smaller number of the precursor MEMS dies 210 fits on an original wafer-sized carrier than are present on the original silicon wafer. The precursor MEMS dies 210 may be placed upside down on the carrier so that after embedding the MEMS dies 210 in the embedding material 252 a surface of the embedding material 252 is substantially flush with a surface of the auxiliary structure 242. A thickness of the embedding material 252 may be selected to provide sufficient mechanical stability for the final sound transducer component 100. In FIG. 2C the embedding material 252 may completely surround the substrate 202 of the precursor MEMS die 210. In alternative embodiments, the embedding material 252 may be filled to a height so that a portion of the substrate 202 protrudes from a second main surface of the embedding material 252 (as mentioned above, the precursor MEMS dies 210 may be placed upside down on the carrier and the embedding material 252 may be poured onto the carrier to fill the gaps between the precursor MEMS dies 210 until the embedding material 252 has the desired height).

Figure 2D:
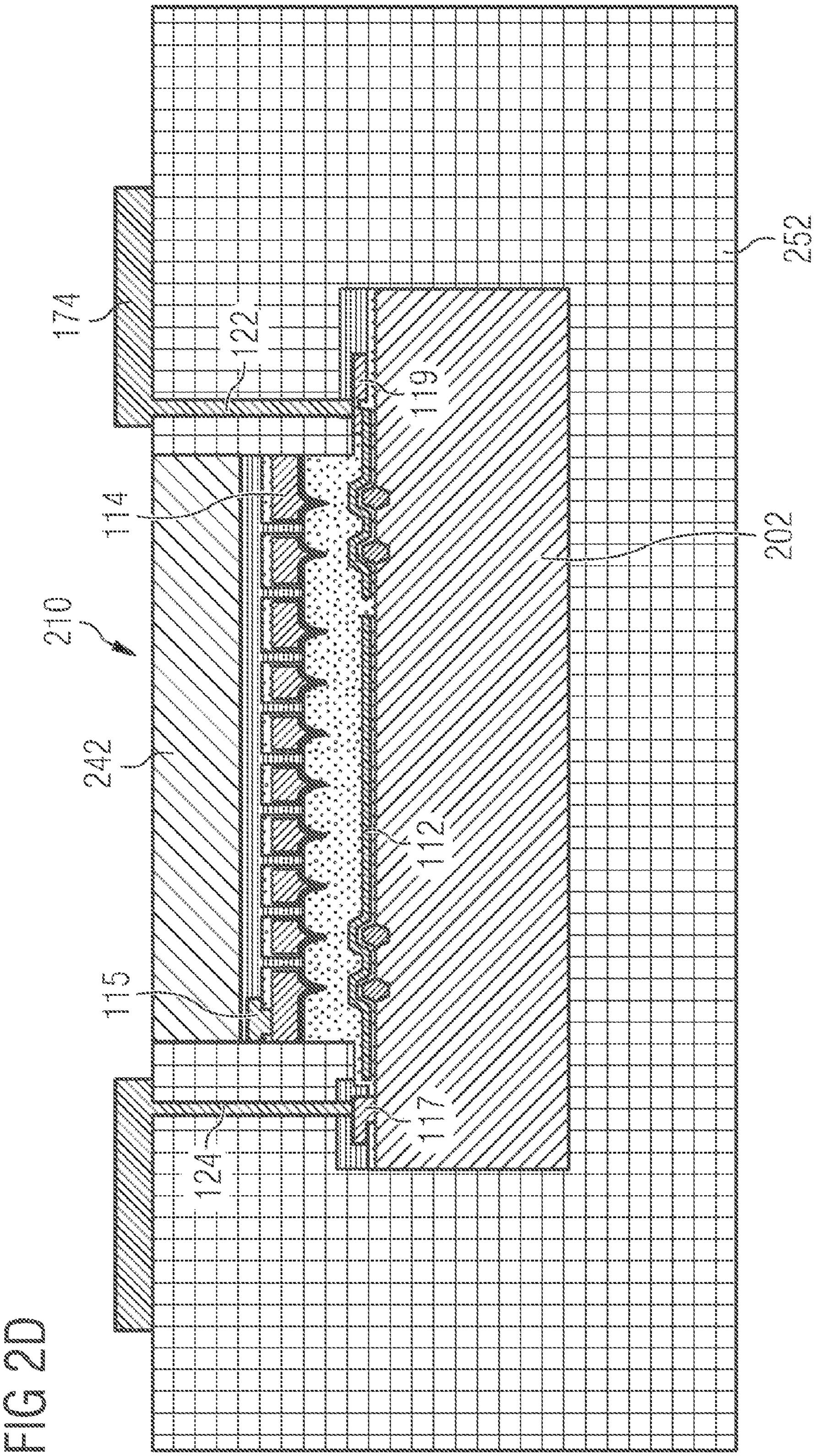

FIG. 2D shows a schematic cross-section of the sound transducer component during the packaging process after a frontside redistribution layer (RDL) 174 has been formed. Furthermore, through contacts or vias 122, 124 may have been formed in the embedding material 252 in order to electrically contact the contacts 117 and 119 of the MEMS die 210. Although not shown in FIG. 2D, a further through contact or via may be provided for the contact 115 which may be used for electrically contacting the backplate 114. The formation of the through contacts 122, 124 and/or of the front side RDL 174 may be performed by laser drilling or by a another suitable method, such as a photolithography-based method.

Figure 2E:
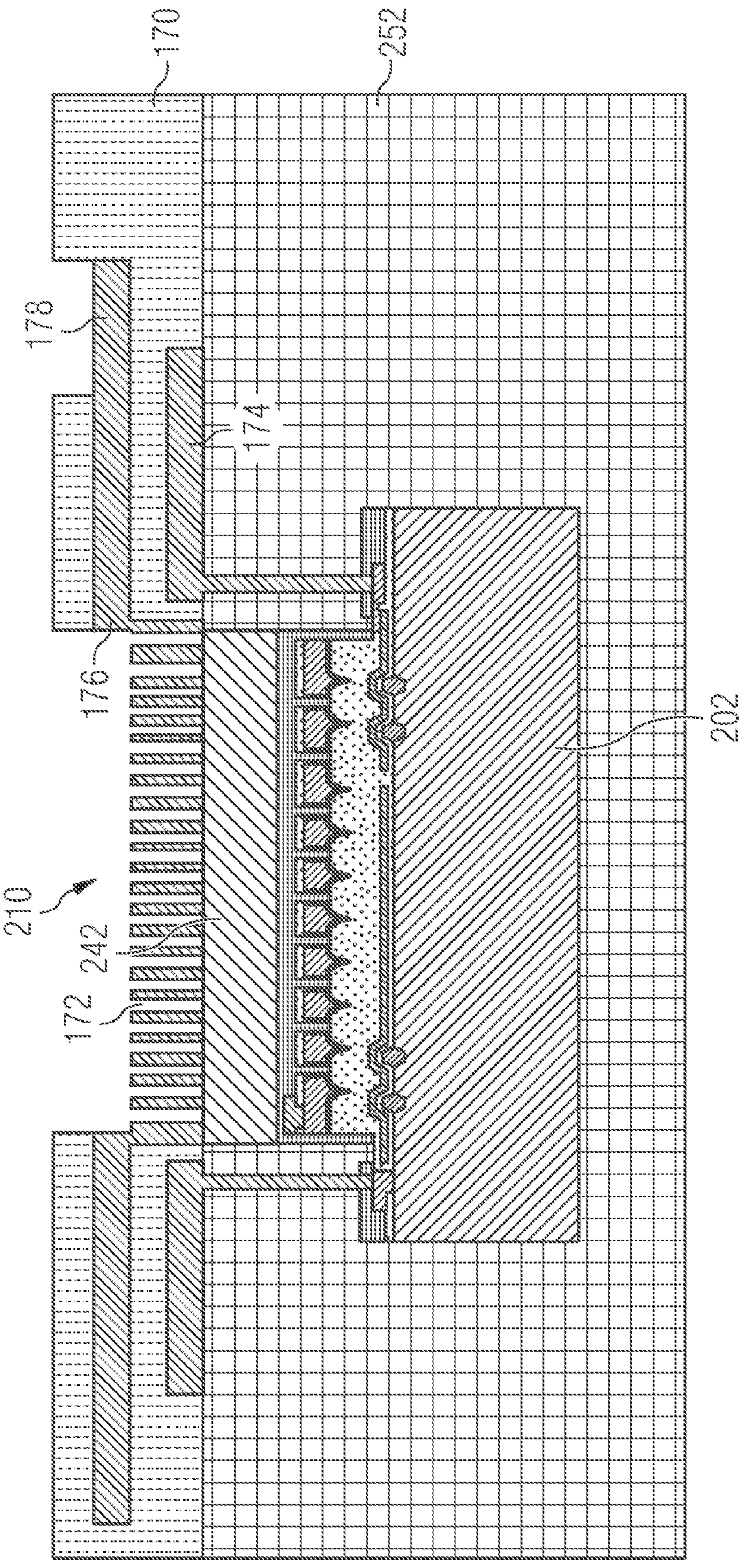

FIG. 2E shows a schematic cross-section after a further step of the packaging process has been performed. In particular, a cover layer 170 may have been deposited at the main surface of the embedding material 252 that may be substantially flush with the exposed surface of the auxiliary structure 242. The cover layer 170 may comprise a LTC-imide (low temperature curing imide). As an alternative, the cover layer 170 may comprise a photoresist, for example SU-8. The cover layer 170 may be deposited in two steps wherein the first step covers the first redistribution layer 174 and provides an intermediate surface. Prior to the second step of the cover layer deposition, the second redistribution layer 176 may be deposited on said intermediate layer and subsequently structured. Furthermore, the grille 172 can also be created at this time. The grille 172 may be created at a surface of the embedded precursor MEMS die 210, and in particular, as schematically illustrated in FIG. 2E, on a surface of the auxiliary structure 242. Alternatively, the grille 172 may be created on a different surface as will be described below in the context of the description of FIG. 3F.

The formation of the grille 172 may in particular comprise: a) depositing a seed layer on the auxiliary structure 242 (for example, by sputtering copper on to the surface of the auxiliary structure 242—sputtered copper is typically unstructured and thus provides seed points for a subsequent copper deposition); b) applying a photoresist on the seed layer; c) exposing selected areas of the photoresist; d) developing the exposed photoresist so that the photoresist is removed at those positions where copper is to be grown on the seed layer; e) growing copper in the openings in the photoresist, e.g., by means of a deposition process; f) removing the remaining photoresist; and g) removing the copper seed layer. The height of the copper that can be grown in step e) is typically related to the thickness of the photoresist so that the height of the grown copper can be at most equal to about the thickness of the photoresist. The copper seed layer may be relatively thin so that it's removal does not significantly modify the grown copper structures forming the grille 172 since these structures are substantially thicker. As an alternative for copper, other suitable materials may be used, in particular metals. The grille 172 may be electrically conductive and may provide EMI shielding or, in embodiments to be described below, may function as a backplate in cooperation with the diaphragm 112.

After the second redistribution layer 176 and the grille 172 have been formed, the second step of the deposition of the cover layer 170 may be performed. The embedding material 252 and the cover layer 170 may be regarded as an embedding arrangement.

Figure 2F:
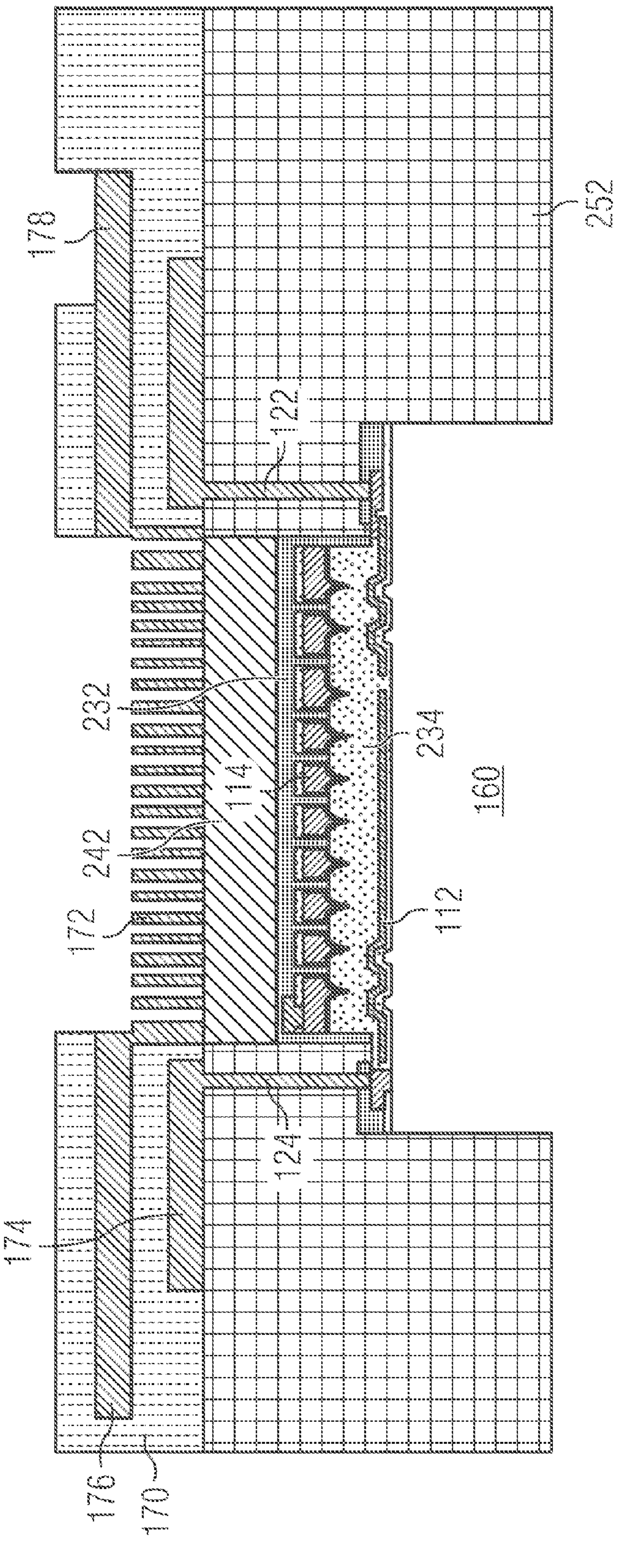

FIG. 2F shows a schematic cross-section after a further step of the method for packaging the MEMS die 210 has been performed. The (backside) cavity 160 may have been formed at a second main surface of the embedding material 252 by removing the substrate 202 of the embedded precursor MEMS die 210, effectively resulting in a substrate-stripped MEMS die (or at least in a partially substrate-stripped MEMS die). The removal of the substrate or bulk silicon 202 may be done by a backside silicon etch step. In order to expose the substrate 202 which may be covered by a layer of the embedding material 252, a grinding step may be performed at the second main surface of the embedding material 252. Alternatively, said portion of the embedding material 252 that covers the substrate 202 may be removed by a chemical reaction, such as partially dissolving or etching away the embedding material 252. Even though the MEMS die 210 may now be stripped of its substrate 202 or of a major part thereof, its individual components, in particular the diaphragm 112 and the backplate 114, may be still in a well defined spatial relation to each other. First of all, the sacrificial material 234 may still be present between the diaphragm 112 and the backplate 114. Moreover, the embedding material 252 may brace the remaining parts of the initial precursor MEMS die 210, namely the diaphragm 112 and the backplate 114.

Figure 2G:
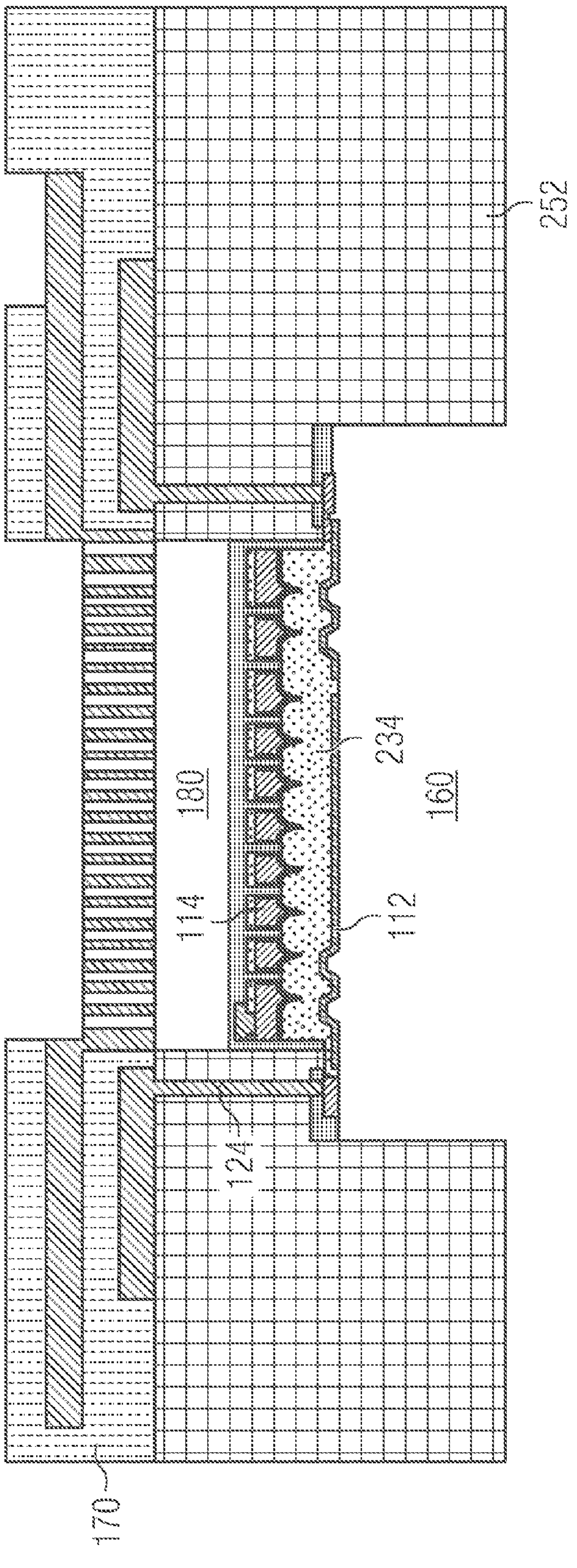

FIG. 2G shows a schematic cross-section after the auxiliary structure 242 between the passivation layer 232 and the grille 172 may have been removed. In this manner, an auxiliary portion (e.g., the auxiliary structure 242) of the embedded precursor MEMS die 210 adjacent to the grille 172 may be removed to create the sound port 180 within the embedding arrangement 252, 170. The removal of the auxiliary structure 242 (e.g., phosphosilicate glass, PSG) may comprise an etching step from the front side. After the removal of the auxiliary structure 242, the sound port 180 or a portion of the sound port 180 may be obtained. As a result, the grille 172 may be disposed in the sound port 180 or across the sound port 180.

Figure 2H:
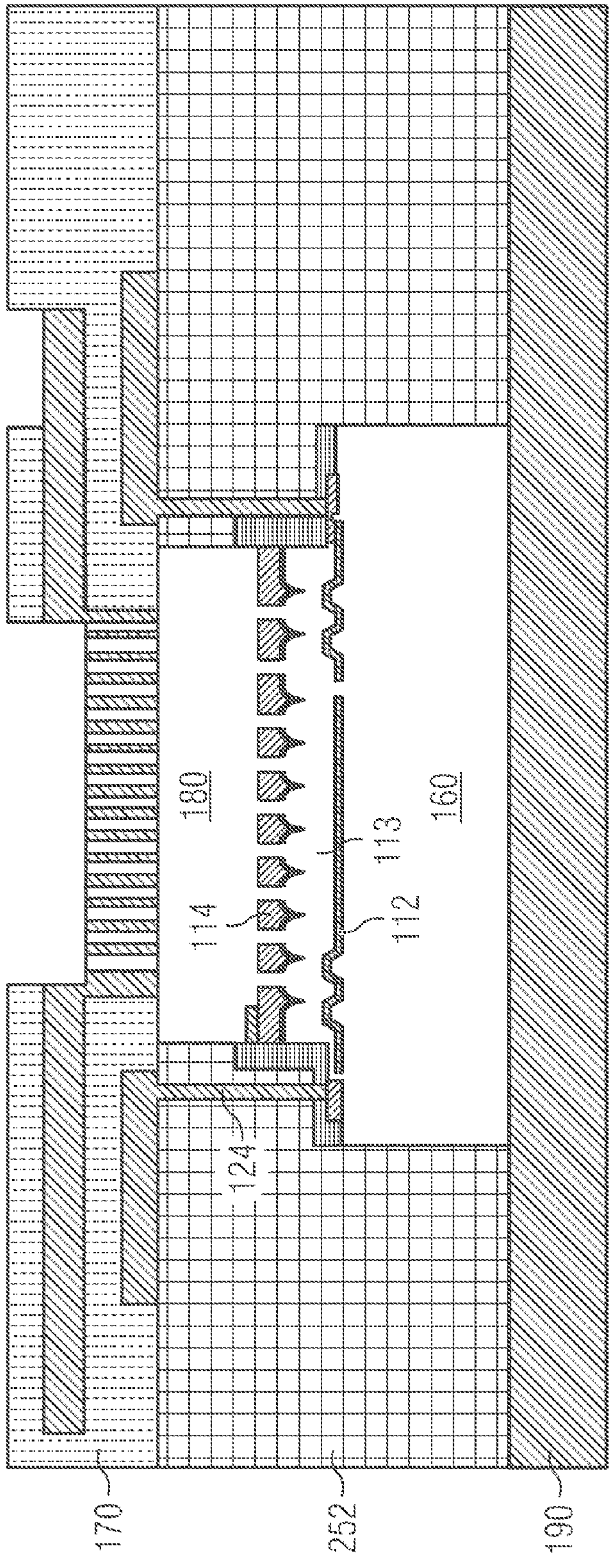

FIG. 2H shows a schematic cross-section after a release etch may have been performed and after backside coverage. By performing the release etch, the sacrificial layer/material 234 may have been removed between the diaphragm 112 and the backplate 114 so that the gap 113 may be created. In FIG. 2H the backside cavity 160 may be closed by a backside cover 190. Backside cover 190 may be a plastic film, an injection molded part that is attached to the mold compound while injection molding the backside cover 190, a small piece of metal, or even a wall of a housing of the system/application layer (e.g., smartphone, tablet PC, digital camera, etc.) in which the sound transducer component 100 is used. The order of the process steps schematically illustrated in FIGS. 2A to 2H may be changed. For example, backside coverage may be performed earlier, e.g., prior to the removal of the auxiliary structure 242.

As mentioned in the previous paragraph, the final sound transducer component (packaged MEMS device) 100 as schematically illustrated in FIG. 1 may be obtained after the passivation layer 232 and the sacrificial material 234 have been removed by suitable etching steps performed from the front side of the sound transducer component 100, i.e., through the openings of the grille 172. The sacrificial material 234 may comprise TEOS (tetraethyl orthosilicate). The mechanical stability of the MEMS part comprising the diaphragm 112 and the backplate 114 may now be provided mainly by the embedding material 252. As can be seen in FIG. 2H, the packaged MEMS device 100 may comprise the MEMS device (comprising primarily the diaphragm 112, the backplate 114, and possibly some remainders of a support structure) which is disposed between the sound port 180 and the backside cavity 160. The packaged MEMS device 100 may further comprise the embedding arrangement (comprising primarily the embedding material 252 and the cover layer 170), the grille 172 which may be disposed in or across the sound port 180, and the backside cover 190.

The described packaging process is believed to have significant potential for reducing the fabrication cost of a sound transducer component because the backside cavity 160 can be formed in a cost-efficient manner, for example by wet etching the substrate 202 of the original MEMS die 210. Expensive etching technologies such as DRIE are not necessary anymore. In contrast, other methods for fabricating and packaging a sound transducer component that do not provide for etching away the substrate 202 after the MEMS die 210 has been embedded by molding into the embedding material 252 may be constrained to create the cavity 160 during the front-end-process, either by DRIE or by a chemical etching step. Note that chemical etching in silicon can typically leads to diagonal or tapered sidewalls (approximately 54°) which means that the cavity 160 would need a much larger footprint area. This increases the required area for the MEMS die on the original silicon wafer, which in turn leads to more "wasted" silicon area. In other words, reducing the amount of wasted area on the original silicon wafer has a great potential regarding cost efficiency and wafer yield.

FIGS. 3A to 3K schematically illustrate a process flow using a sequence of schematic cross sections for an implementation example that avoids the auxiliary material 242 and instead uses a first partial layer of the cover layer 170 as a basis for depositing and structuring the material for forming the grille 172.

Figure 3A:
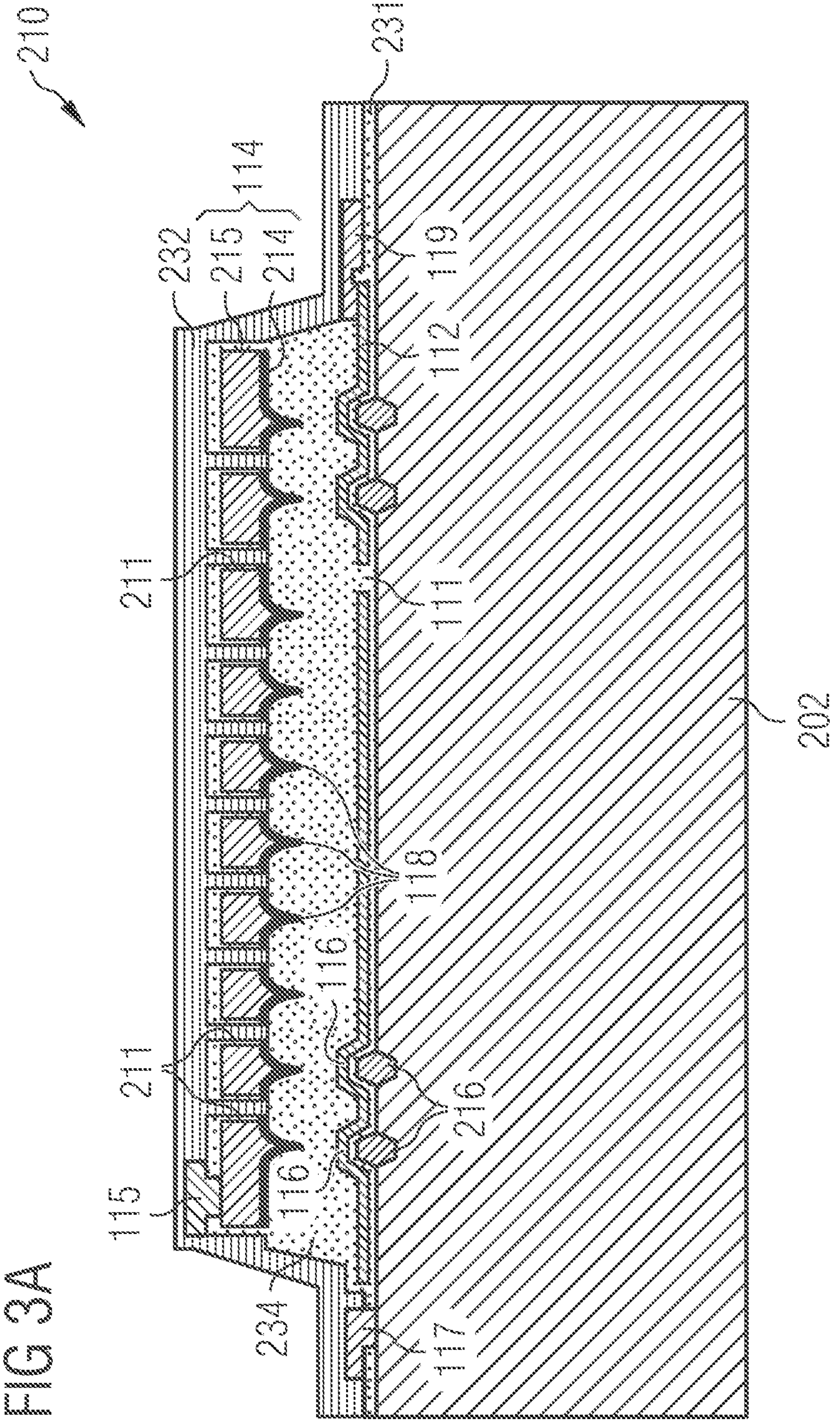
FIGS. 3A to 3L show schematic cross sections of process steps of a method for packaging a MEMS device of, e.g., a sound transducer component, wherein a sound port is created within a cover layer.

FIG. 3A is similar to FIG. 2A and schematically shows the MEMS die 210 prior to packaging.

Figure 3B:
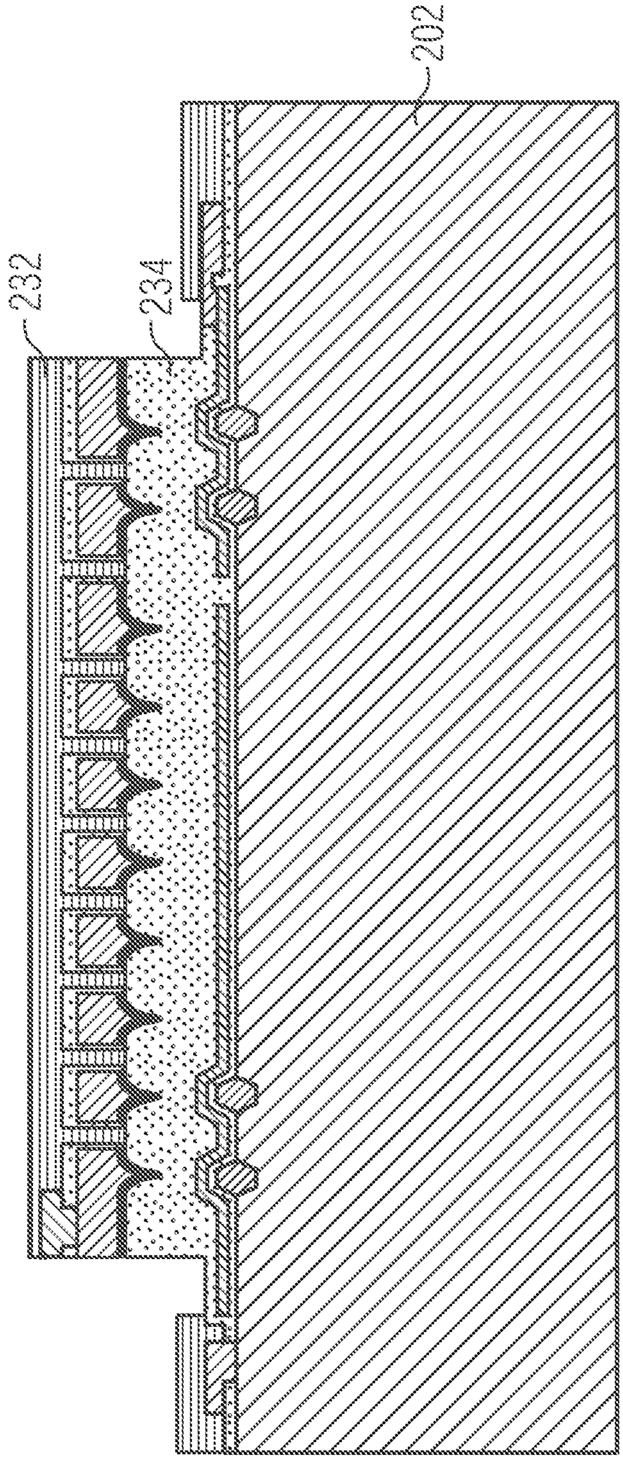

FIG. 3B shows a schematic cross-section of the precursor MEMS die 210 after the passivation layer 232 may have been structured in order to expose portions of the backplate 114 and of the diaphragm 112. In this manner, the embedding material 252 may come into contact with said portions of the backplate 114 and of the backplate 112 in order to eventually function as a support structure for the backplate 114 and the diaphragm 112. The passivation layer 232 may be structured by an anisotropic etching process, such as reactive ion etching (RIE). The difference to the implementation example shown in FIG. 2B is that in the implementation example of FIG. 3B no auxiliary structure 242 is used. The passivation layer 232 may be planarized.

Figure 3C:
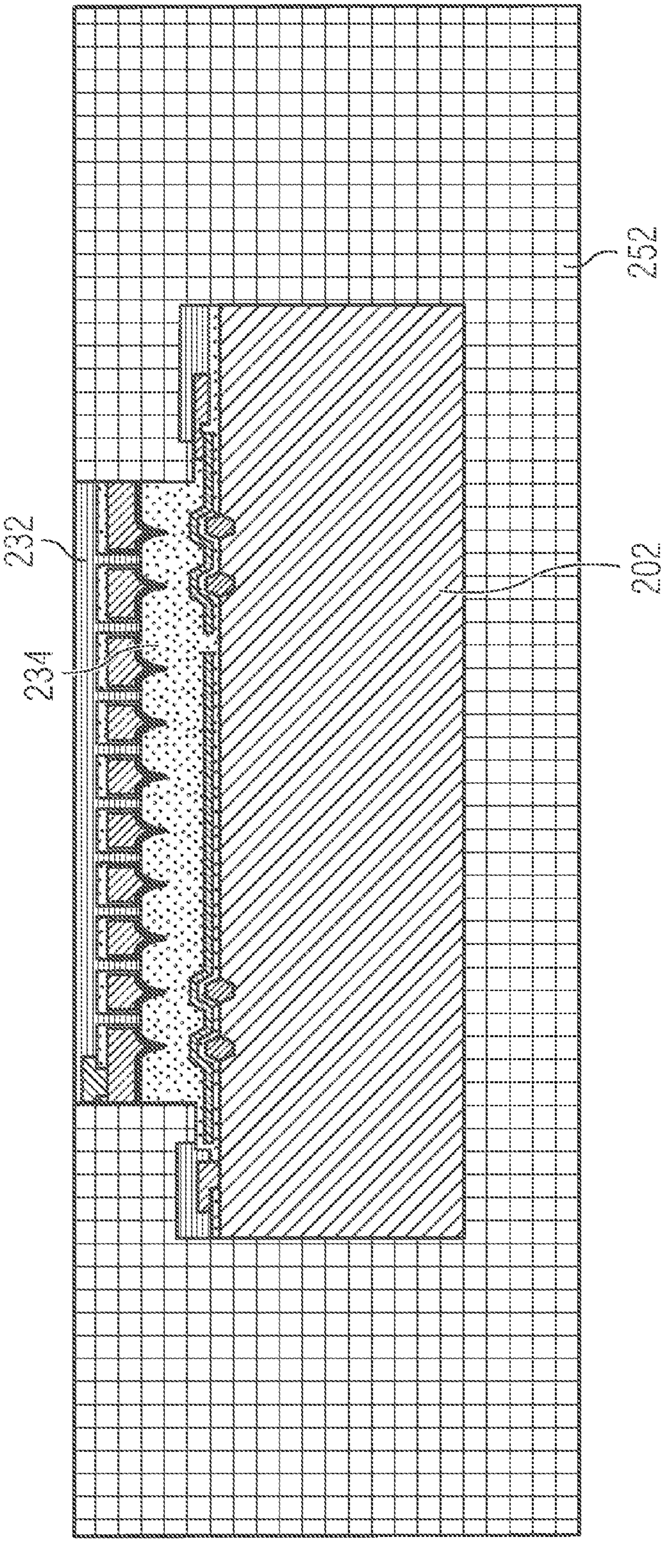

FIG. 3C shows a schematic cross-section of the MEMS die 210 after it has been embedded by molding into a embedding material 252. The surface of the passivation layer 232 may be substantially aligned or flush with the surface of the embedding material 252.

Figure 3D:
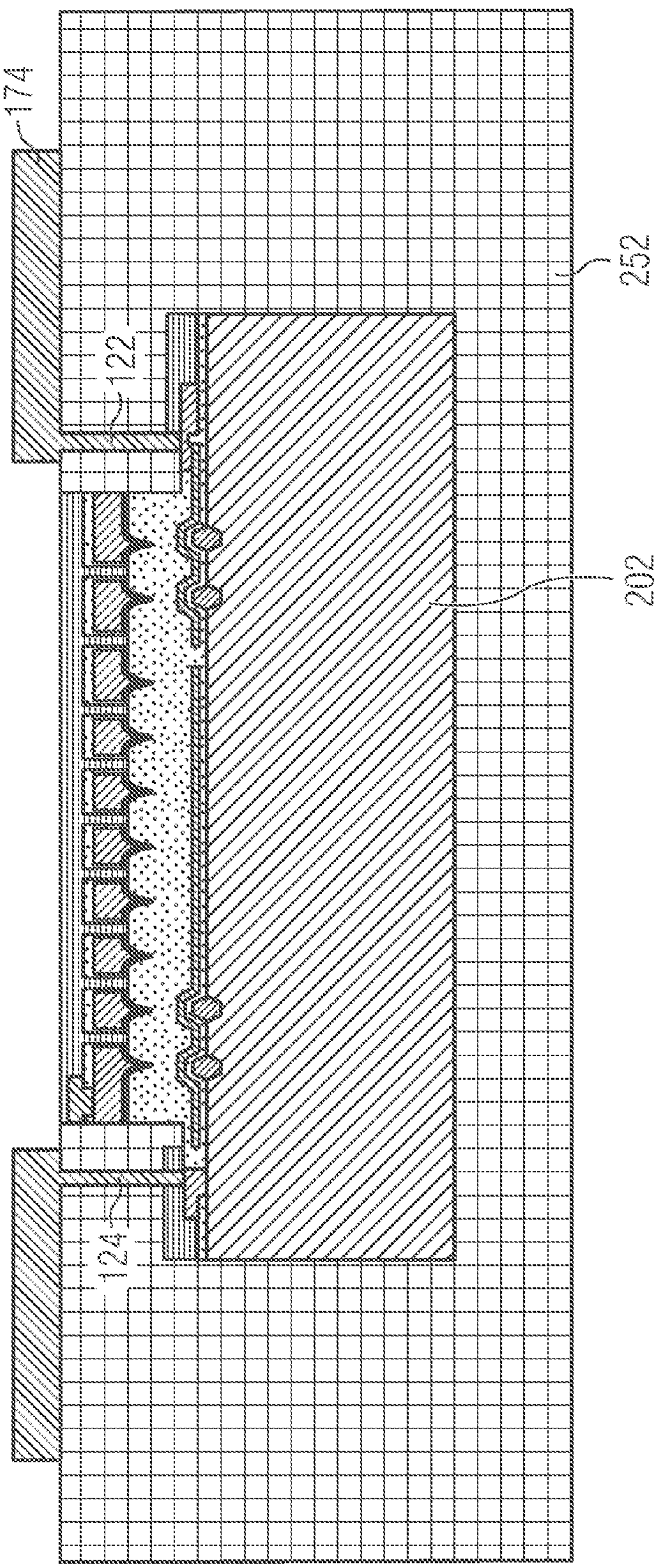

FIG. 3D shows a schematic cross-section of the sound transducer component during the packaging process after a frontside redistribution layer (RDL) 174 may have been formed. Furthermore, through contacts or vias 122, 124 may have been formed in the embedding material 252 in order to electrically contact the contacts 117 and 119 of the MEMS die 210.

Figure 3E:
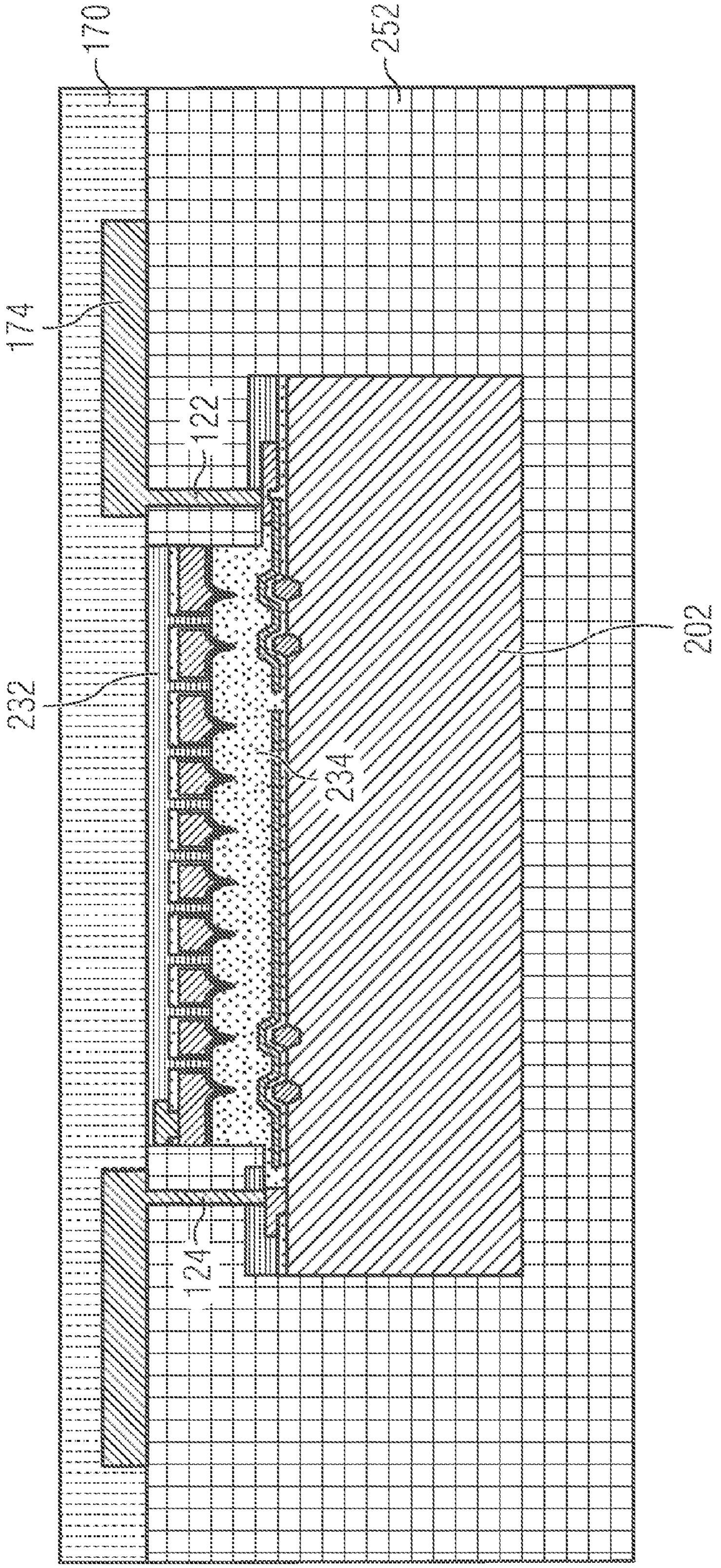

FIG. 3E shows a schematic cross-section of the embedded precursor MEMS die after a further step of the packaging process may have been performed. In particular, a first portion of a cover layer 170 may have been deposited at the main surface of the embedding material 252 that is substantially flush with the exposed surface of the passivation layer 232. The first portion of the cover layer 170 may cover the first redistribution layer 174 and may provide an intermediate surface of the embedding precursor MEMS die. The first portion of the cover layer 170 may comprise imide, LTC-imide, and/or SU-8.

Figure 3F:
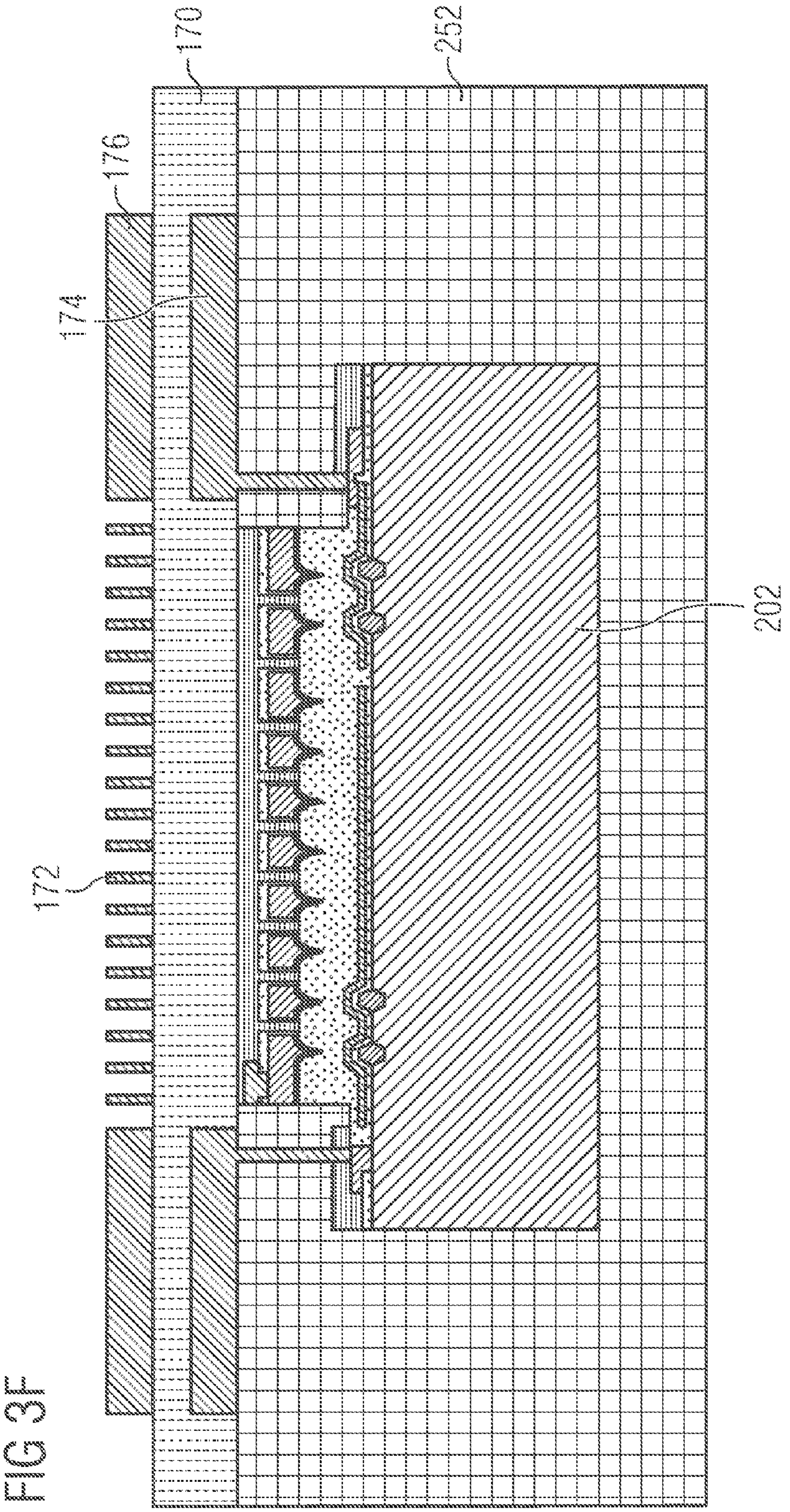

FIG. 3F shows a schematic cross-section after a second redistribution layer 176 and a grille 172 have been formed at the intermediate surface. In this manner, the second redistribution layer 176 and the grille 172 may be provided in a common plane. In particular, there is no step between the grille 172 and the second redistribution layer 176 as in the implementation example shown in FIG. 2E. The absence of the step between the grille 172 and the second redistribution layer 176 may be beneficial in terms of easier manufacturing.

Figure 3G:
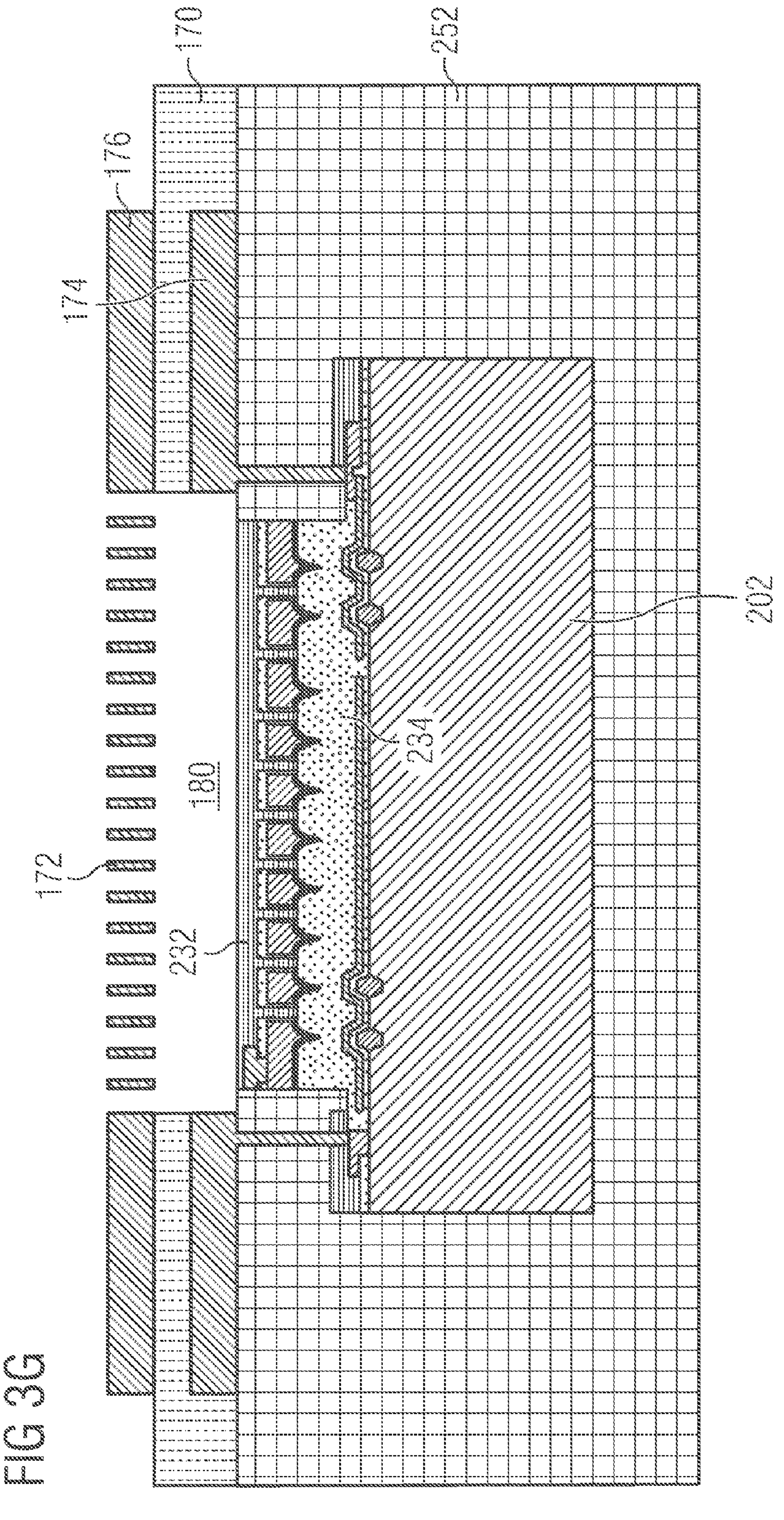

In FIG. 3G a portion of the cover layer 170 located between the grille 172 and the passivation layer 232 may have been removed to create the sound port 180. Said portion of the cover layer 170 may be removed by introducing an etching agent, a solvent, or an oxidant through the openings of the grille 172. In other words, an auxiliary portion of the embedded precursor MEMS die adjacent to the grille 172 may be removed.

Figure 3H:
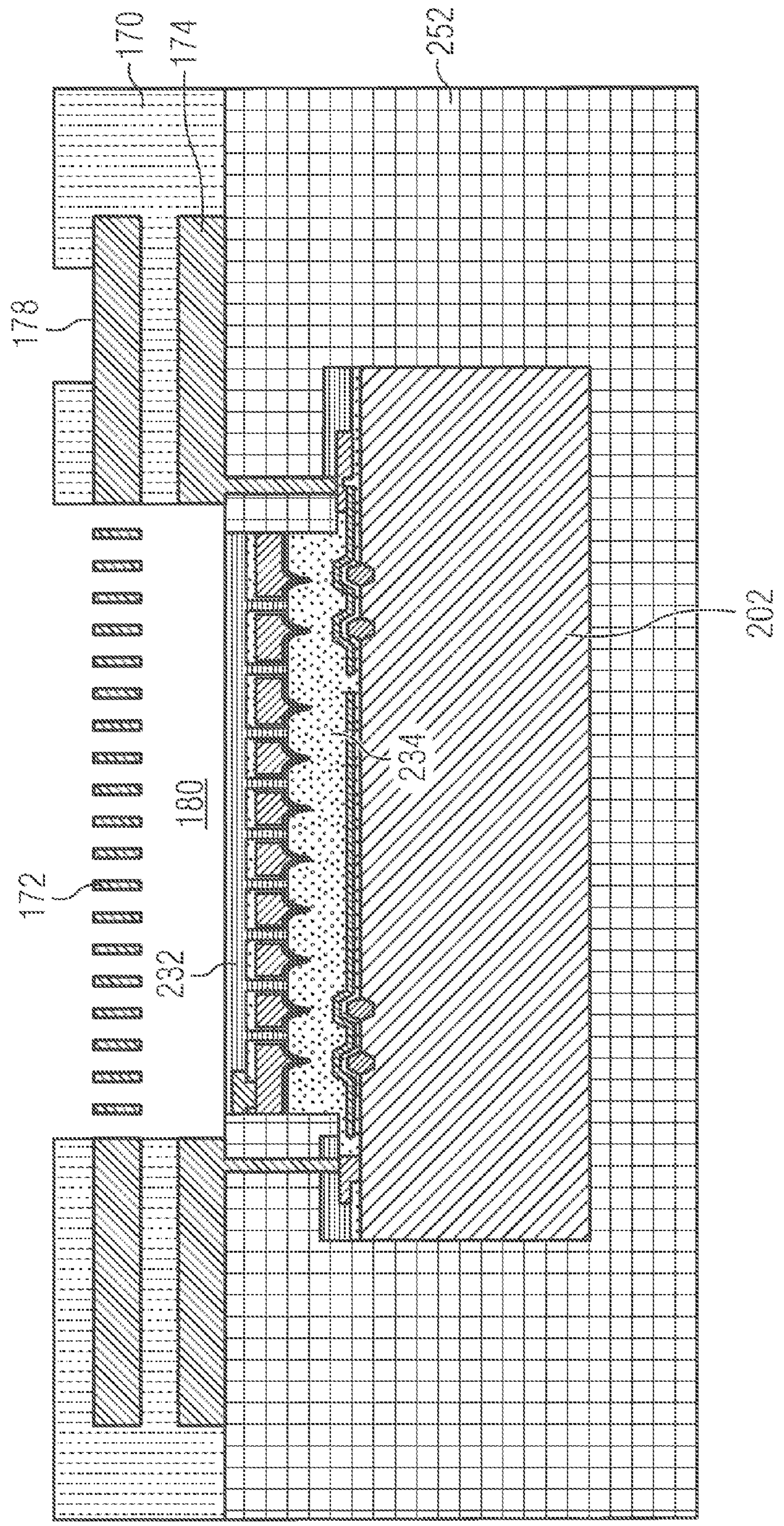

FIG. 3H shows a schematic cross-section after a second layer of the cover layer 170 has been provided that covers the second redistribution layer 170, for example by a deposition process. The area of the grille 172 and of the contact pad 178 may be omitted from covering with the second layer of the cover layer 170. In the alternative, the cover layer 170 may be structured after deposition, in order to expose the grille 172 and the contact pad 178. It may also be possible to perform the step corresponding to FIG. 3H prior to FIG. 3G so that the cover layer 170 is first completed (i.e., deposition and structuring) before creating the sound port 180.

Figure 3I:
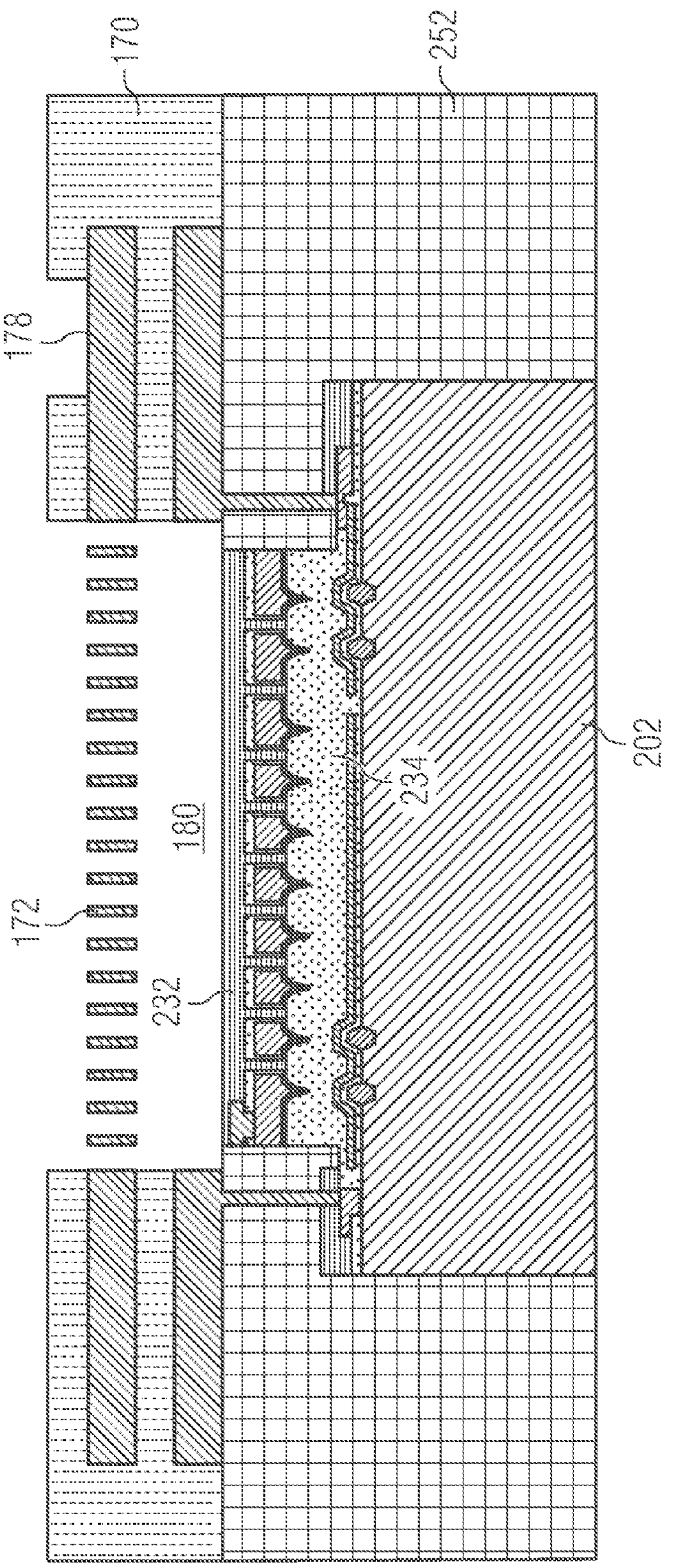

In FIG. 3I a portion of the embedding material 252 may have been removed at a side opposite to the cover layer 170 so that the substrate 202 of the MEMS die 210 may be exposed.

Figure 3J:
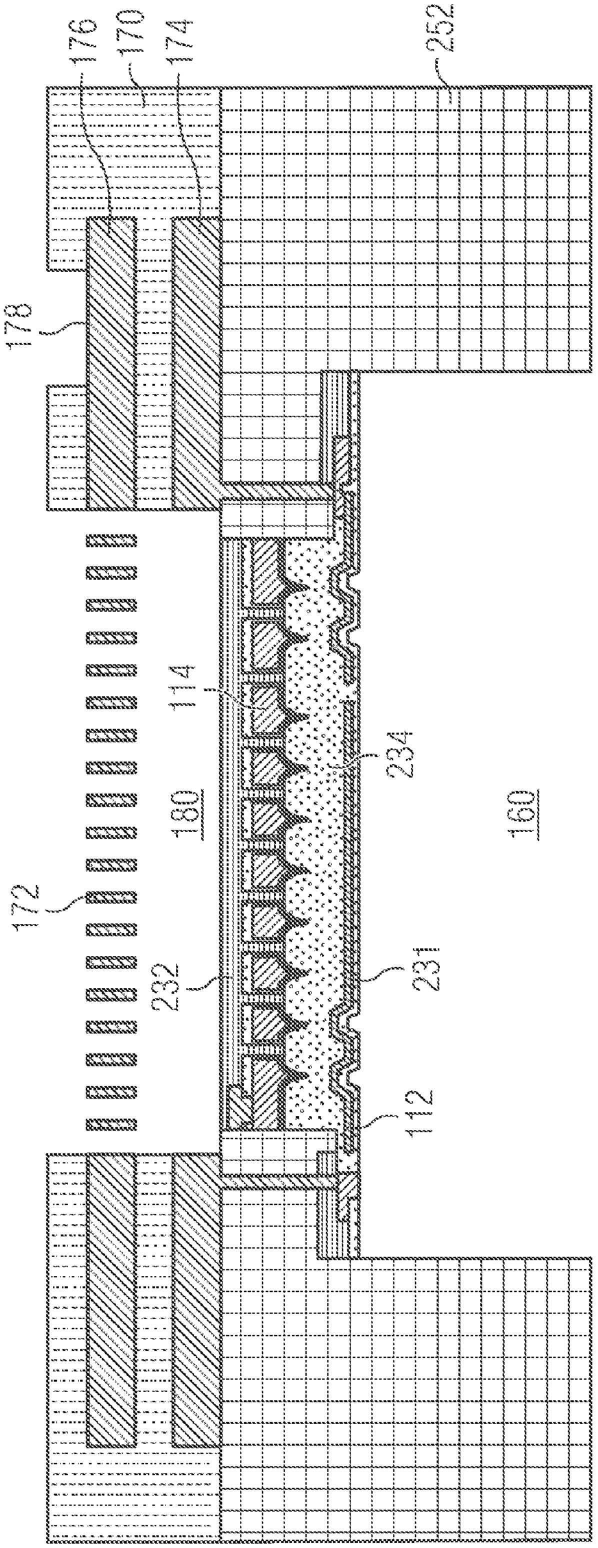

FIG. 3J shows a schematic cross section of the packaging process of the MEMS die 210 after the substrate 202 of the MEMS die 210 has been removed. In this manner, the backside cavity 160 may be created. The removal of the substrate 202 may comprise an etching step which may stop at the etch stop layer 231.

Figure 3K:
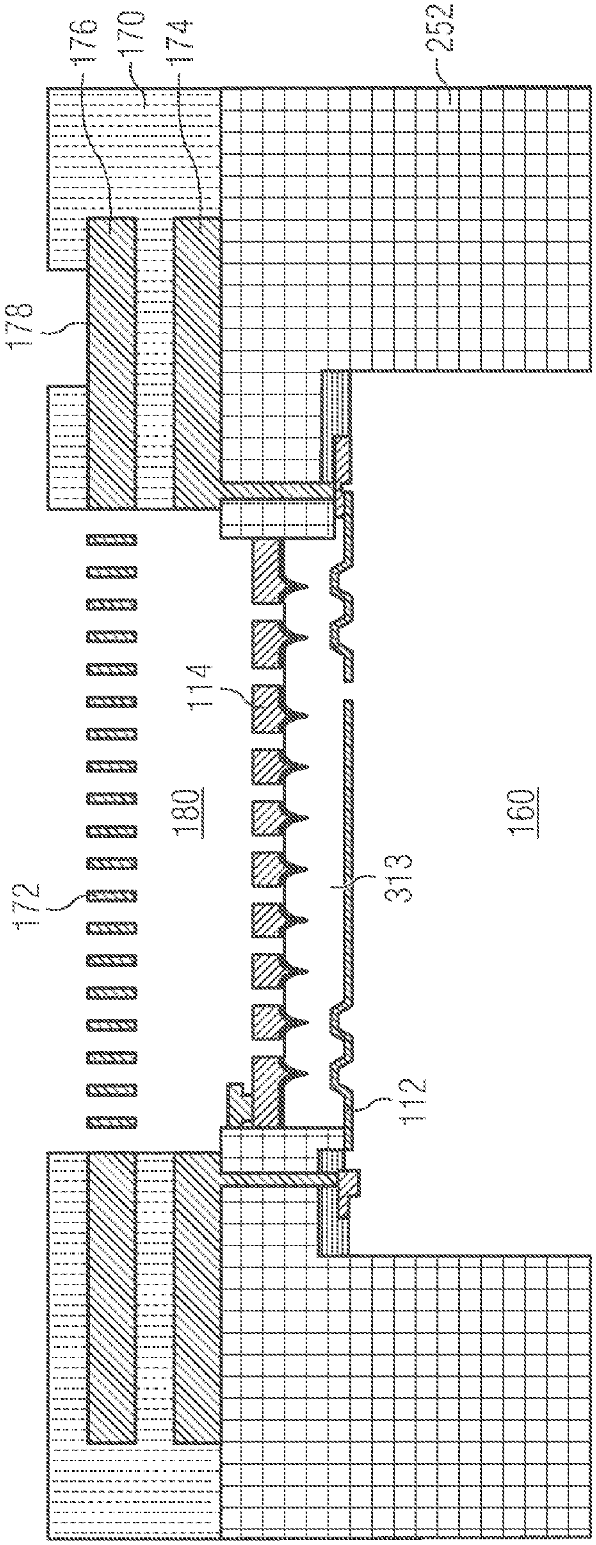

FIG. 3K schematically shows the result of the release etch by which the sacrificial material 234 may be removed between the diaphragm 112 and the backplate 114 to provide the gap 313. Concurrently, the etch stop layer 231 may be removed, if the same material or a similar material is used for the etch stop layer 231 and for the sacrificial material 234.

Figure 3L:
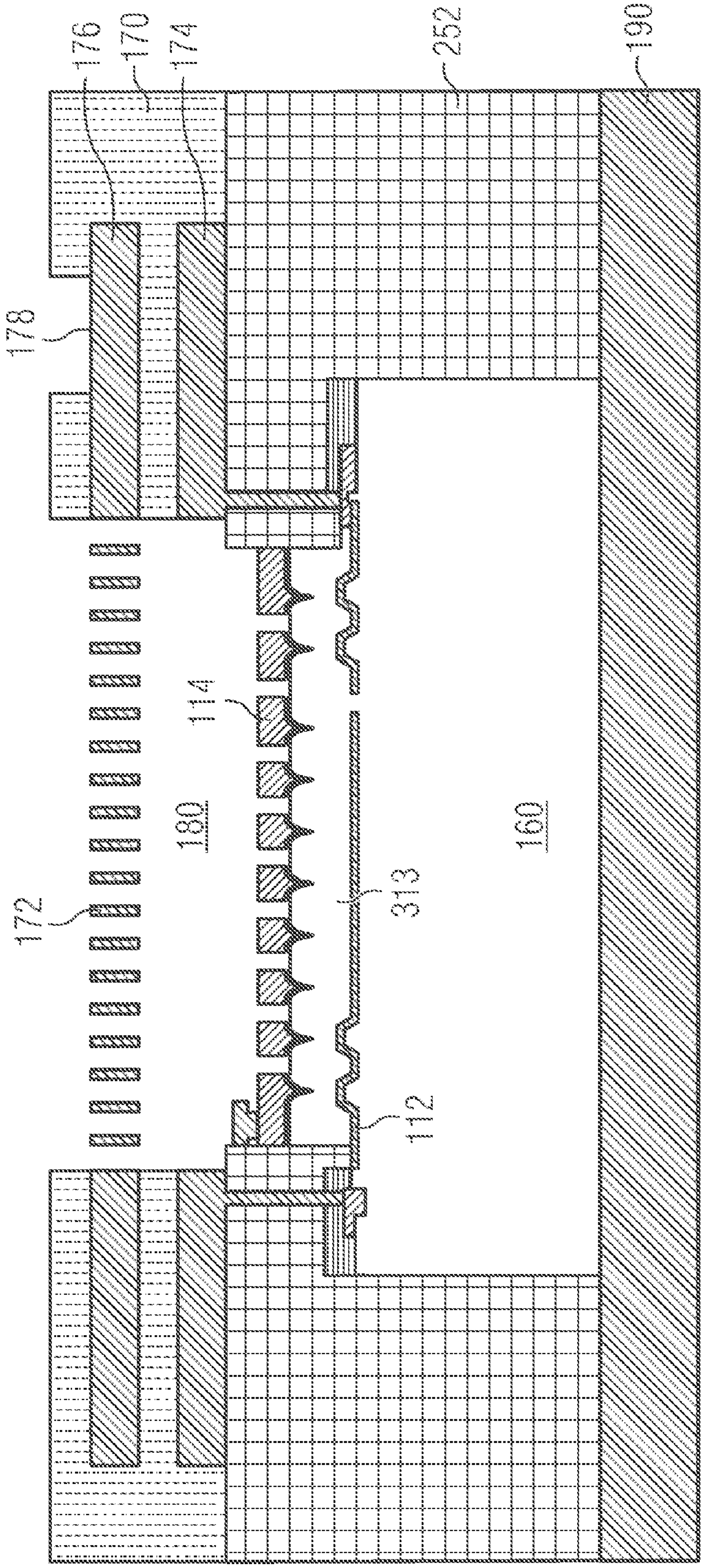

FIG. 3L shows the finished sound transducer component comprising a back cover 190 to close the cavity 160. In other words, FIG. 3L shows a schematic cross section of a packaged MEMS device comprising a MEMS device, a sound port 180 adjacent to the MEMS device, an embedding arrangement 252, 170 that encapsulates the MEMS device and the sound port 180, and a grille 172 within the sound port. As shown in FIG. 3L, the MEMS die may be recessed with respect to a first main surface of the embedding material 252, i.e., the surface that interfaces with the cover layer 170. The recess may be caused by the passivation layer 232 that was originally present at the precursor MEMS die and subsequently removed to provide an acoustic and/or fluidic access from the exterior to the backplate 114 and the diaphragm 112. The grille 170 may be disposed in or across the sound port 180.

Figure 4A:
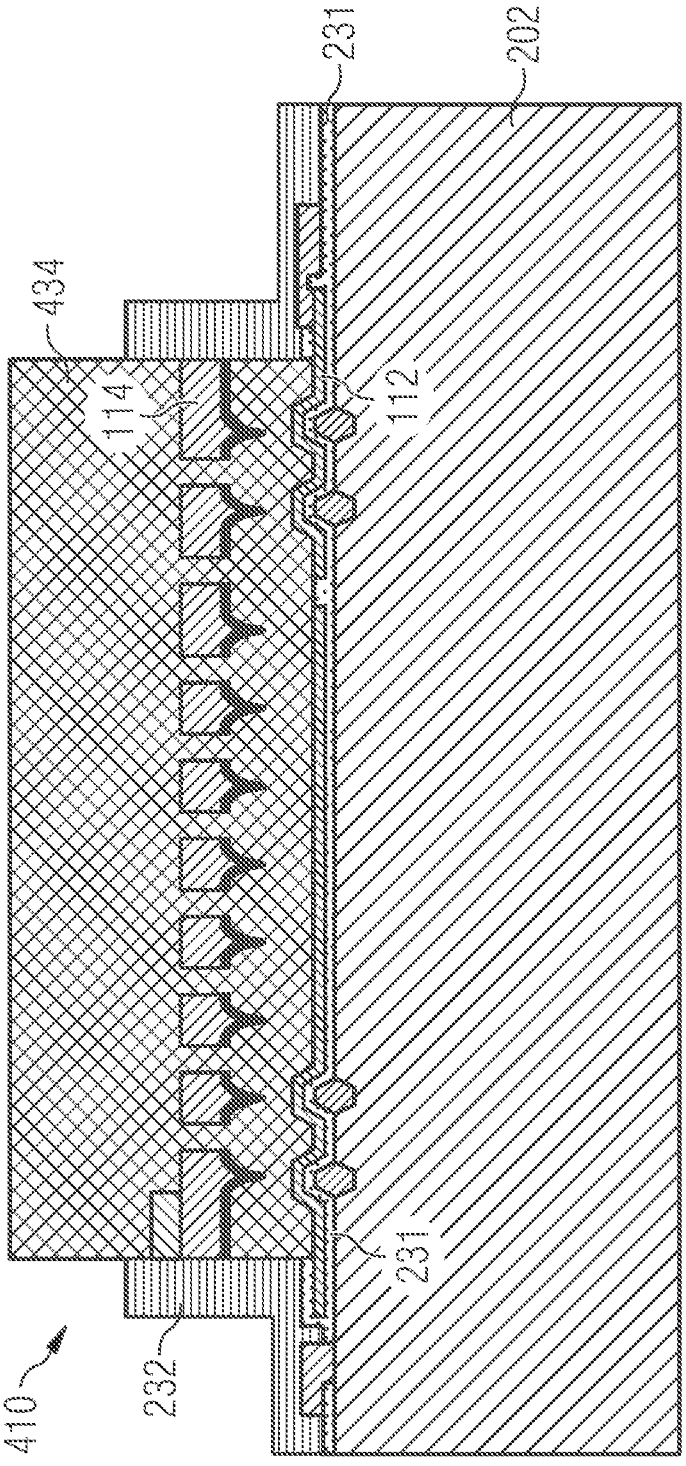
FIGS. 4A to 4G show schematic cross sections of method steps of a method for packaging a MEMS device of, e.g., a sound transducer component, wherein carbon is used as a sacrificial layer.

FIGS. 4A to 4G schematically illustrate a process flow using a sequence of schematic cross sections for the implementation example that may use a carbon sacrificial layer 434 instead of the TEOS sacrificial layer 234. According to the implementation example presented in FIGS. 4A to 4G, the passivation layer 232 and the auxiliary structure 242 in the example according to FIGS. 2A to 2H may also be made of carbon, i.e., the sacrificial layer and optionally the protective cover layer are made from carbon. FIG. 4A shows a schematic cross-section of the precursor MEMS die 410 as it may be output by the front-end-process and possibly before singulating. The carbon layer 434 may fill the spaces that will eventually be transformed into the gap 113 between the MEMS diaphragm 112 and the backplate 114 and also the space that will eventually be occupied by (a portion of) the sound port 180. The carbon sacrificial layer 434 may furthermore fill the perforation holes that are formed in the backplate 114. The carbon sacrificial layer 434 may be formed in several phases which may be separated by a deposition and structuring of another material, such as the material for the backplate 114.

Figure 4B:
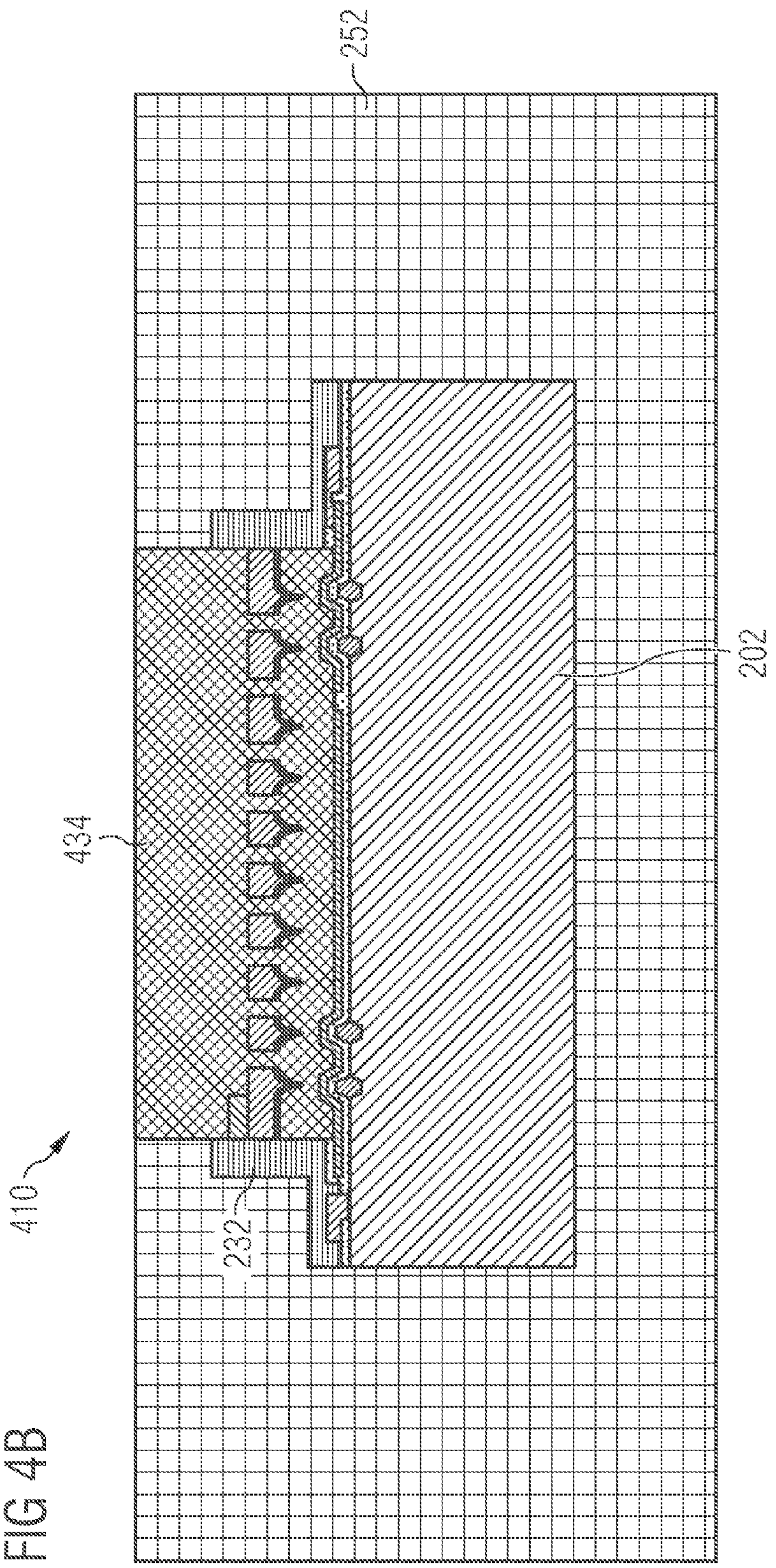

FIG. 4B shows a schematic cross-section after chip singulation and embedding the precursor MEMS die 410 into the embedding material 252. A portion of the passivation layer 232 or of the support structure of the precursor MEMS die 410 may still be present and may also be embedded into the embedding material 252.

Figure 4C:
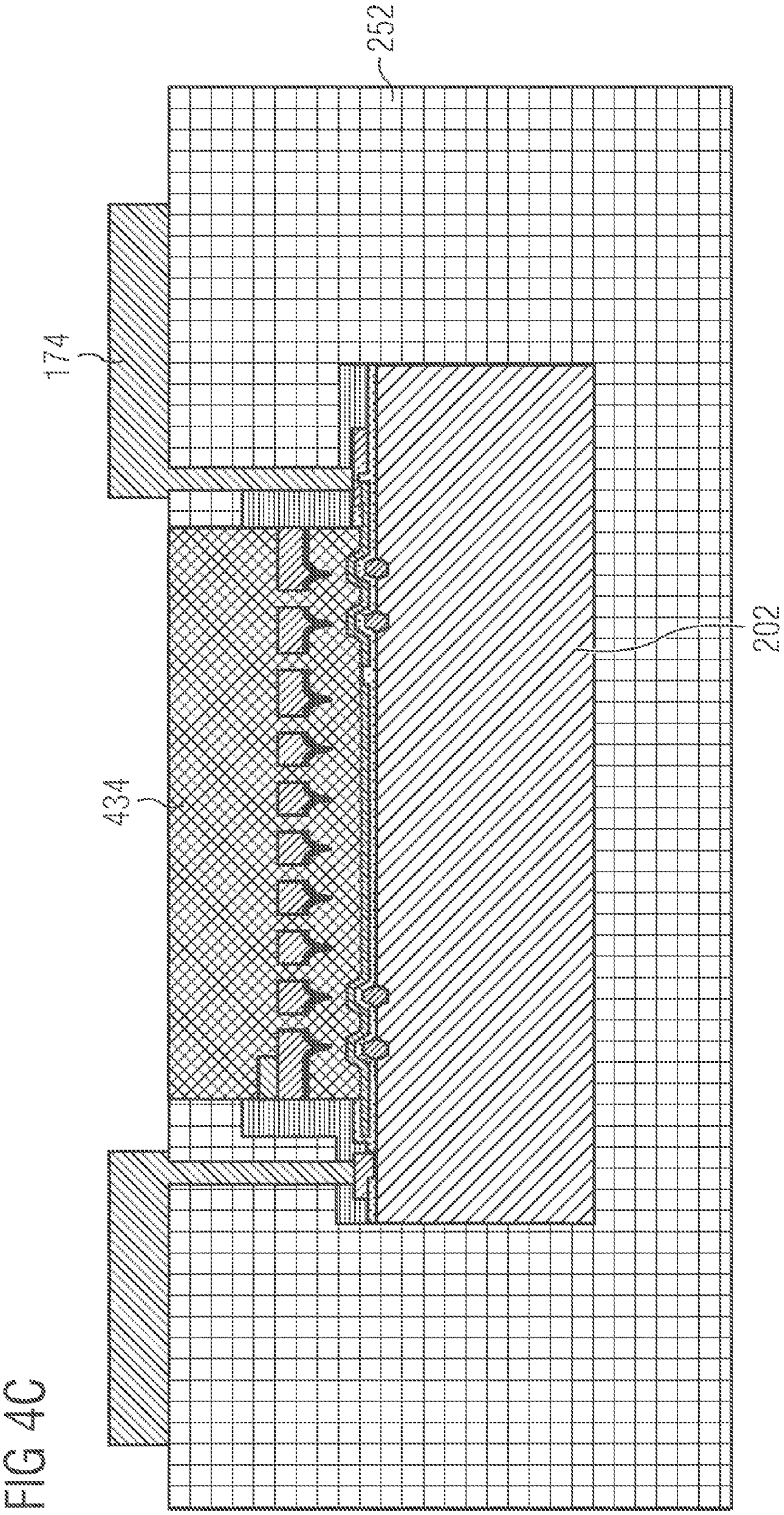

FIG. 4C shows a schematic cross-section of the semi-finished sound transducer component after a process step to form a front side redistribution layer has been performed at a first main surface of the embedding material 252. This method step may involve via-laser and a first copper layer (first CU) 174.

Figure 4D:
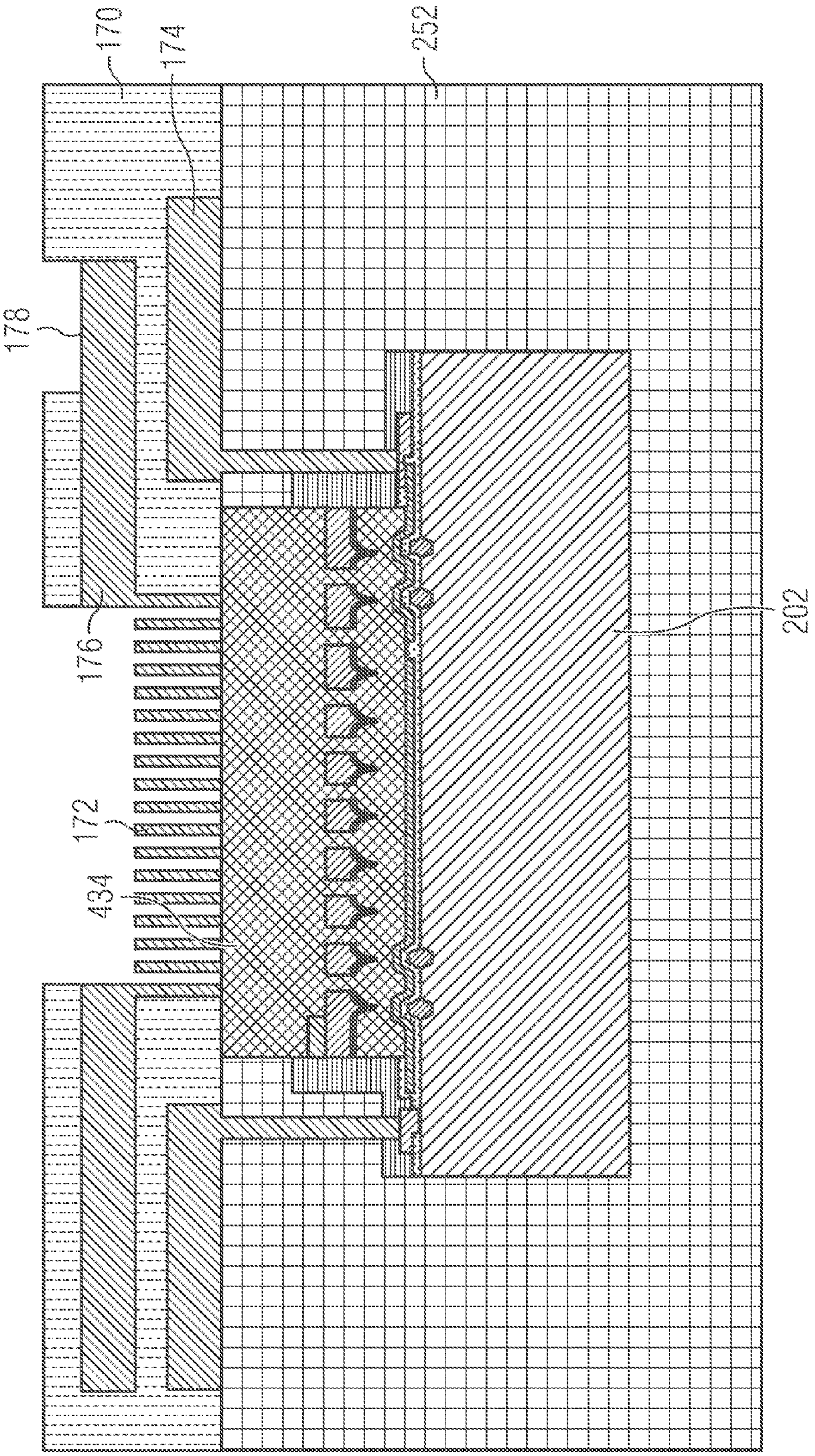
Figure 4E:
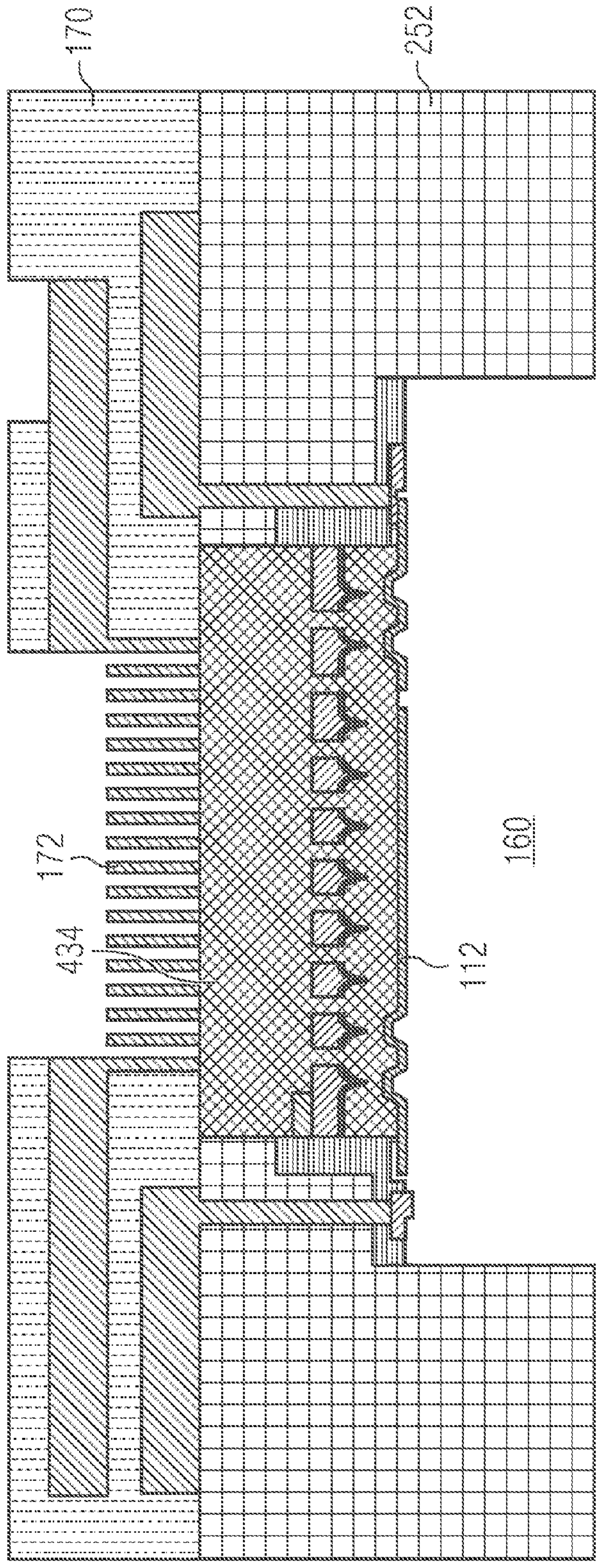

FIG. 4D shows a schematic cross-section after a second front side RDL has been performed. In a larger sense, the second front side RDL may comprise the deposition or formation of a first layer of the cover layer 170 (e.g., LTC-imide), a second copper layer 176 and a further layer of the cover layer 170 (e.g., LTC-imide). The grille 172 may be formed as described above. Once this step has been performed, the structure as schematically illustrated as a cross-section view in FIG. 4E is obtained. The substrate 202 and also the etch stop oxide 231 (see, for example, FIG. 4A) may be removed so that the backside cavity 160 has been created.

Figure 4F:
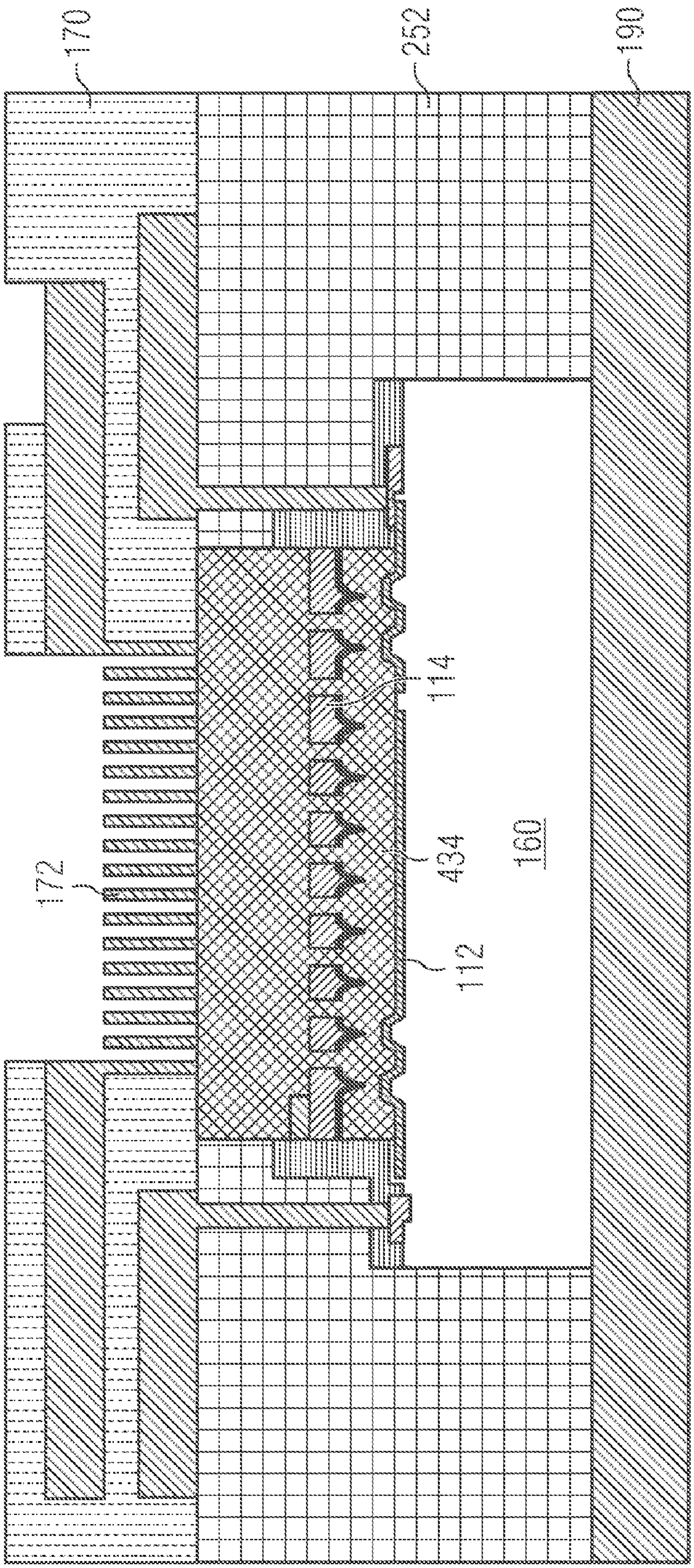

FIG. 4F shows a schematic cross-section after a backside coverage has been done using a backside cover 190.

Figure 4G:
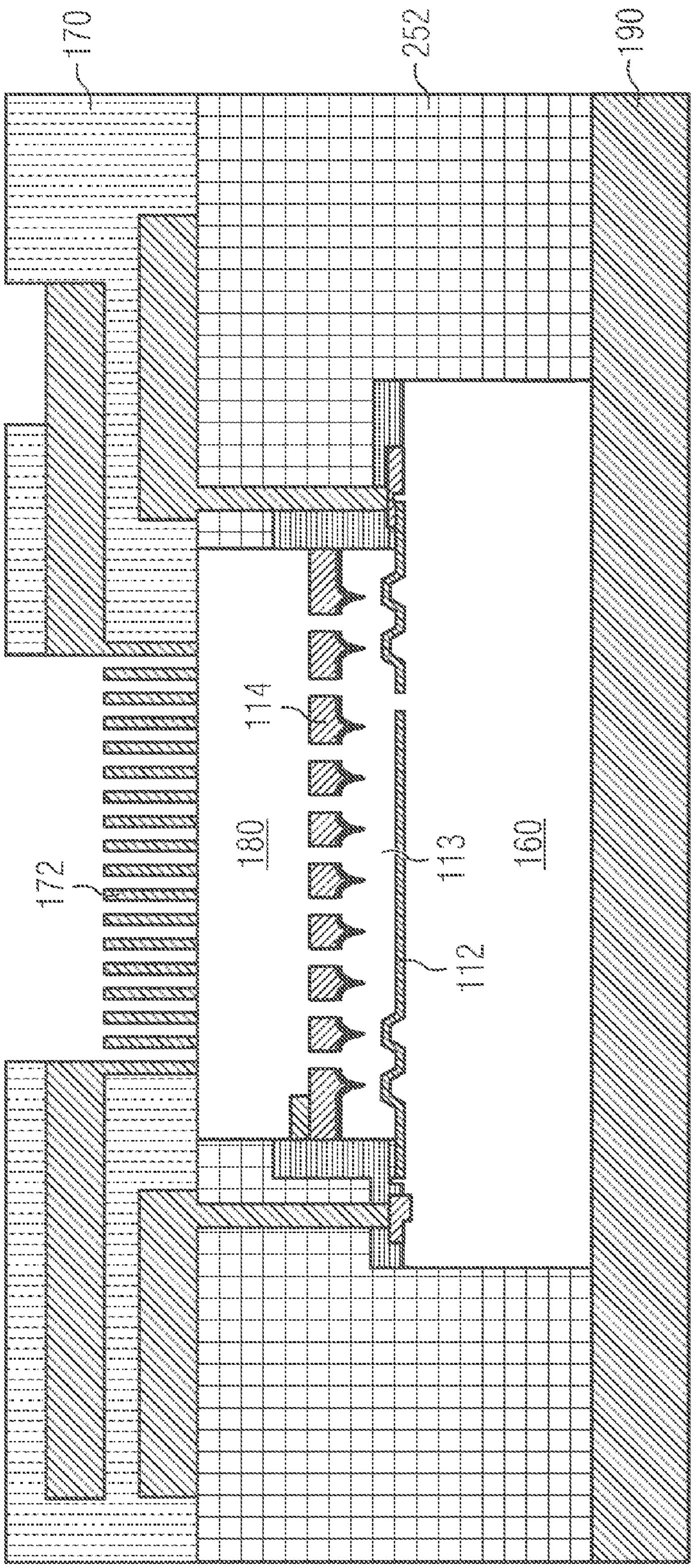

FIG. 4G shows a schematic cross section after the method steps of fast dry release etch of the protection layer and sacrificial layer carbon 434 by oxide plasma etch. According to alternative embodiments, the release etch can be done prior to backside coverage, especially in the case of bottom backplate microphones or double backplate microphones, as the gap 113 between the diaphragm 112 and the backplate electrode 114 is more easily accessible through the backplate 114, due to the perforation of the backplate 114.

Figure 5A:
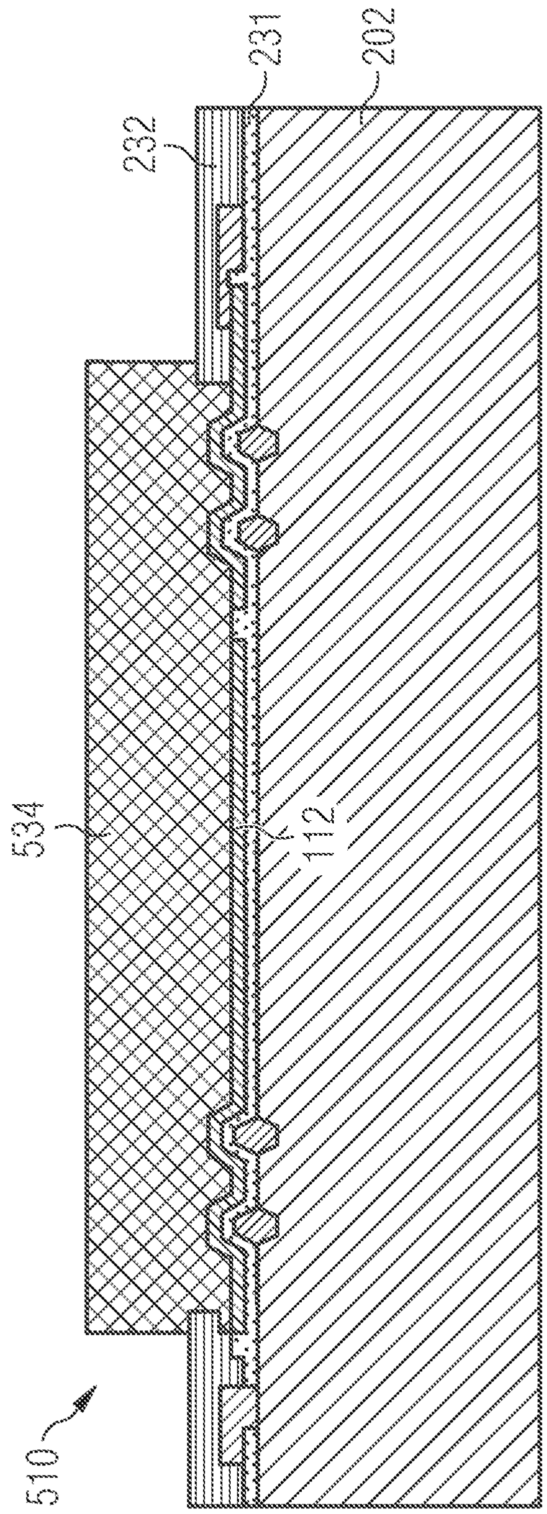
FIGS. 5A to 5F show schematic cross sections of method steps of a method for packaging a MEMS device, wherein the package comprises a part of the sound transducer structures.

In FIGS. 5A to 5F to be described next, a possible implementation example is presented where the package serves as a part of the MEMS. FIG. 5A shows a schematic cross-section of a precursor MEMS die 510 as it may be present on the original silicon wafer output by the front-end wafer process. The precursor MEMS die 510 may comprise the substrate 202, the etch stop layer 231, a remaining portion of a passivation layer 232, the membrane 112, and the sacrificial layer 534. Accordingly, the silicon die 510 may comprise only the membrane layer 112 plus the sacrificial layer 534 on top, but not a backplate layer. The sacrificial layer 534 may be TEOS or carbon or any other suitable sacrificial material.

Figure 5B:
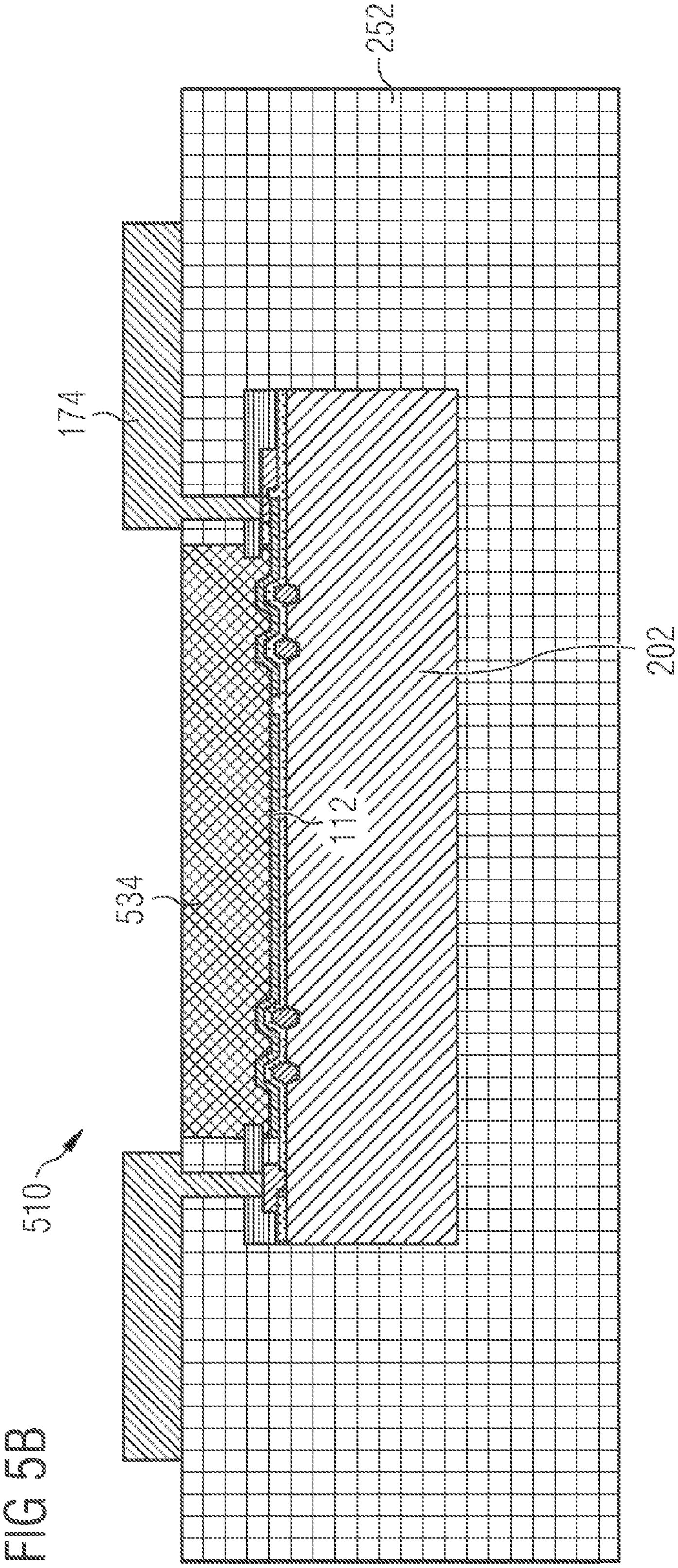

FIG. 5B shows a schematic cross-section after the preliminary MEMS die 510 has been embedded by molding into the embedding material 252. Furthermore, a front side RDL (1) may have been done using via-laser and a first copper layer 174.

Figure 5C:
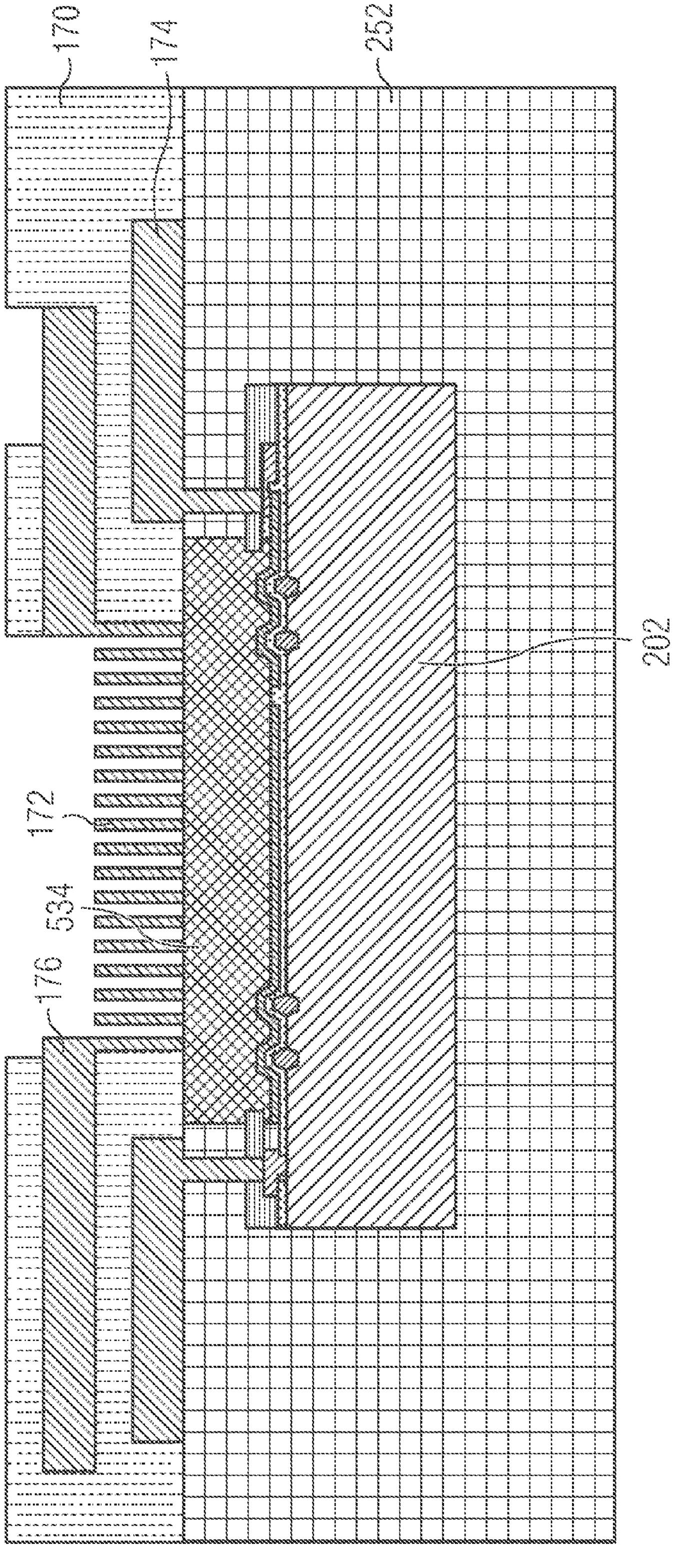

FIG. 5C shows a schematic cross-section where a second front side RDL step may have been performed including forming a first LTC-imide layer, a second copper layer 176 and a second LTC-imide layer. The cover layer 170 may thus comprise the LTC-imide layers and the first and second copper layers 174, 176. An electrically conductive grille 172 may also be formed or created at an exposed surface of the sacrificial layer 534.

Figure 5D:
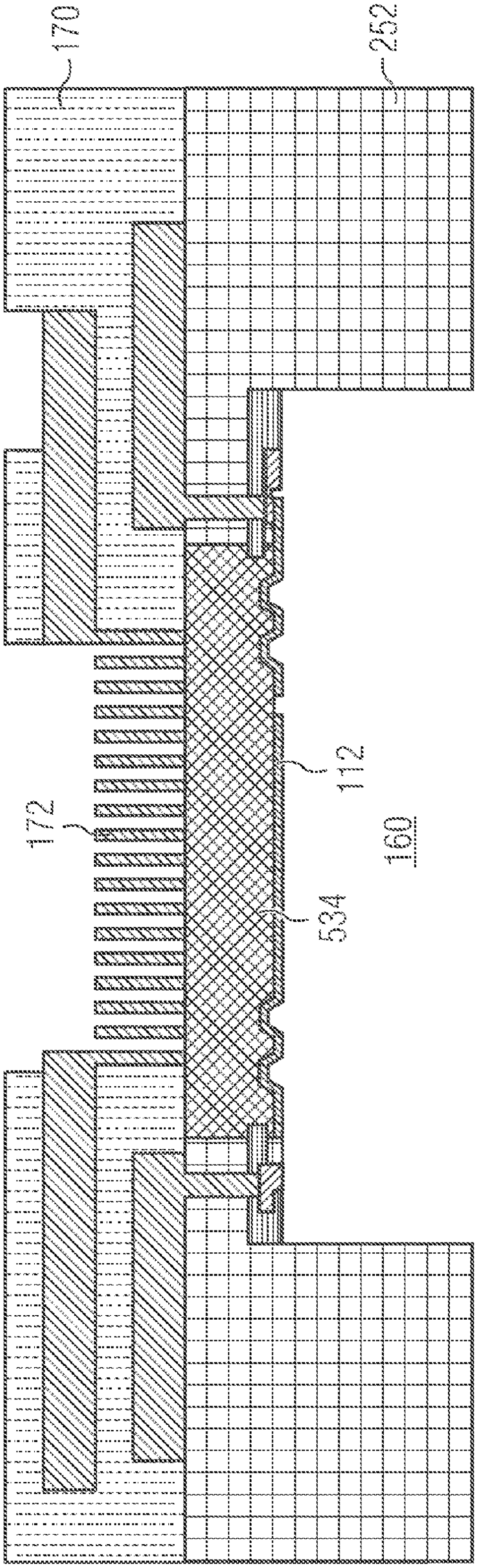

FIG. 5D shows a schematic cross-section after grinding, silicon etching, and stop oxide etching at a backside of the semi-finished sound transducer component. In this manner, the backside cavity 160 may be formed in the space originally occupied by the substrate 202 of the MEMS die 510.

Figure 5E:
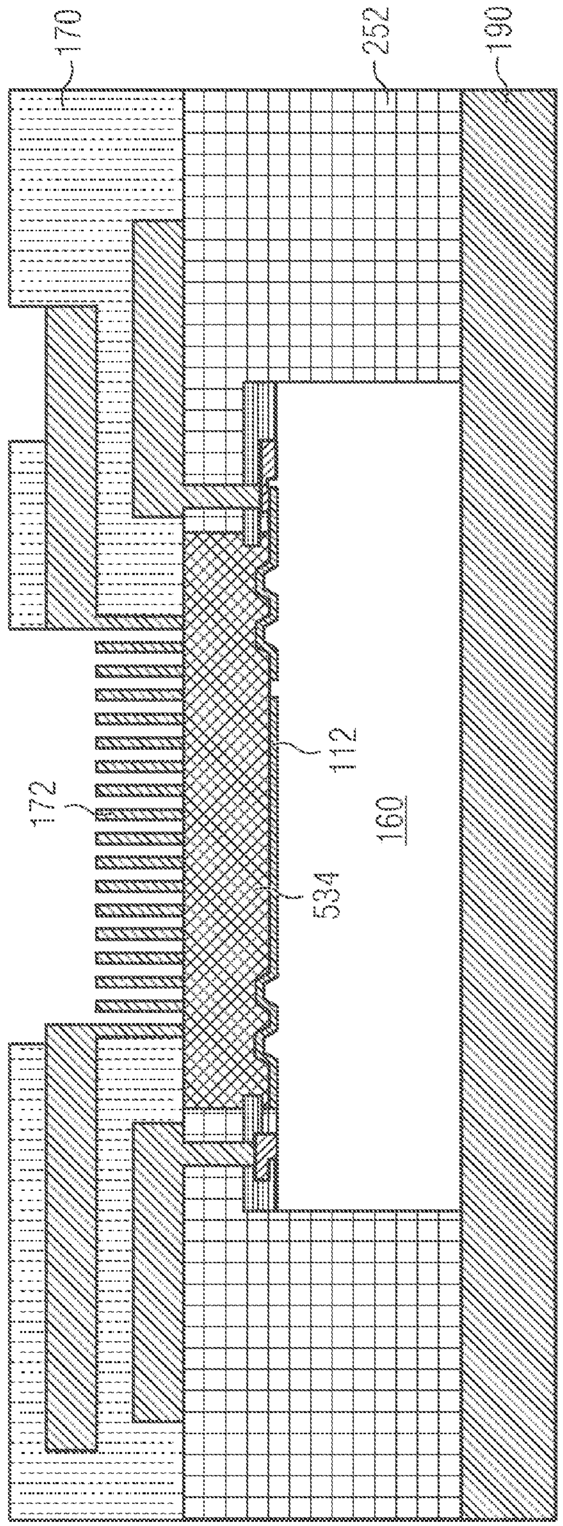

In the schematic cross section of FIG. 5E the backside cavity 160 may have been covered by the backside cover 190.

Figure 5F:
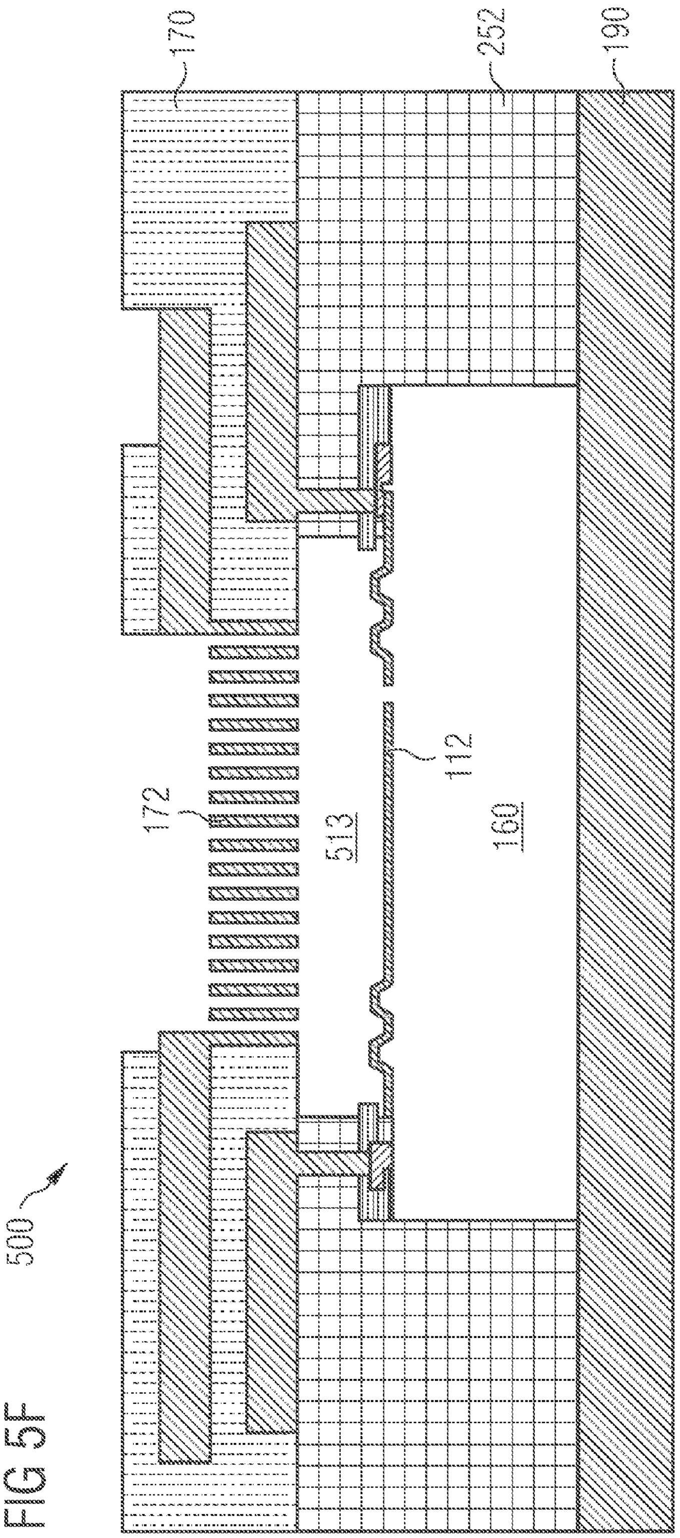

After the fast dry release etch of the protection layer and sacrificial layer carbon 534 by oxide plasma etch, the structure schematically illustrated in the cross-section of FIG. 5F may be obtained. The removal of the protection layer and sacrificial layer carbon 534 may leave the gap 513 between the diaphragm 112 and the grille 172 which may now serve as the perforated backplate or counterelectrode of the MEMS transducer. As already mentioned before, the release etch can be done prior to backside coverage (FIG. 5E). The schematic cross-section in FIG. 5F substantially shows the finished sound transducer component 500.

The sound transducer component 500 may comprise the perforated backplate 172 generated by the second redistribution layer (RDL (2)). The air gap 513 may be controlled by carbon/oxide layer thickness. The silicon membrane or diaphragm 112 may be relatively well controlled by the front-end-process. Depending on the intended application of the sound transducer component, the air gap 513 and the perforated backplate 172 might not require as high a precision as the silicon diaphragm 112 and may therefore also be produced during the back-end-of-line processing or the packaging.

According to further implementation examples, the MEMS die 110, 210, 410, 510 may comprise a spacer 234, 334, 434, 534 that may be arranged at an opposite side of the diaphragm 112 than the cavity 160. The spacer may be at least partially embedded in the embedding material 252 during the step of embedding the MEMS die in the embedding material. The method may further comprise forming the grille 172 on a surface of the spacer 234, 334, 434, 534.

The method may further comprise removing the spacer 234, 334, 434 to form a transducer opening (sound port) 180 extending to the diaphragm 112 within the embedding material 252.

The method may further comprise a step of forming a first cover layer at a first surface of the embedding material 252. The first cover layer may comprise a (first) redistribution layer 174. The redistribution layer 174 may be configured to provide electrical contact for the MEMS die 110.

The method may further comprise embedding by molding a further die such as an ASIC into the embedding material 252. The redistribution layer(s) 174, 176 may be configured to provide an electrical connection between the MEMS die 110 and the further die, e.g., the ASIC.

The method may further comprise forming a second redistribution layer 176 within the cover layer 170. The second redistribution layer 176 may provide electromagnetic interference (EMI) shielding for the (first) redistribution layer(s) 174.

According to a further implementation example a sound transducer component may comprise an embedding material 252, a substrate-stripped MEMS die 110 embedded by molding into the embedding material 252, a cavity 160, and a transducer opening (sound port) 180. The MEMS die may comprise a diaphragm 112 for sound transduction. The cavity 160 may be formed within the embedding material 252 and maybe in (fluidic or acoustic) contact with the diaphragm 112. The transducer opening 180 may be formed within the embedding material 252 and may be in (fluidic or acoustic) contact with the diaphragm 112 at an opposite side of the diaphragm 112 than the cavity 160.

A further possible example of implementation is provided by a method for packaging a MEMS die of a sound transducer component. The method may comprise forming or creating a plurality of spacers 234, 334, 434, or 534 at a surface of a wafer comprising a plurality of precursor MEMS dies (e.g., precursor MEMS dies) 210, 410, 510. Each spacer may cover at least a portion of a diaphragm of a corresponding MEMS die. The method may further comprise singulating wafer to obtain a plurality of singulated semi-finished precursor MEMS dies. A selected number of the plurality of singulated precursor MEMS dies may then be embedded by molding in an embedding arrangement comprising an embedding material 252 to form a reconstitution wafer. The singulated precursor MEMS dies may be embedded together with their corresponding spacers. The method may also comprise removing at least a portion of the plurality of spacers to obtain a plurality of sound ports 180 within the embedding arrangement 252. The reconstitution wafer may then be singulated to thereby form the sound transducer component. A spacer may be or comprise the auxiliary structure 242, 434, or 534. In the alternative or in addition, a spacer may be or comprise a portion of the passivation layer 232, and/or a portion of the cover layer 170.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Although each claim only refers back to one single claim, the disclosure also covers any conceivable combination of claims.

What is claimed is:

1. A packaged MEMS device comprising:

an embedding arrangement comprising a mold compound;

a MEMS device embedded in the mold compound of the embedding arrangement, wherein the MEMS device comprises a diaphragm for sound transduction, and wherein the mold compound braces the diaphragm;

a sound port embedded in the mold compound of the embedding arrangement, the sound port acoustically coupled to the MEMS device; and a grille disposed in the sound port.

2. The packaged MEMS device according to claim 1, wherein the grille is electrically conductive.

3. The packaged MEMS device according to claim 2, wherein the grille is configured to function as a backplate of a capacitive transducer in combination with the diaphragm.

4. The packaged MEMS device according to claim 1, wherein the embedding arrangement comprises a main embedding part and a cover layer at a first surface of the main embedding part, the main embedding part comprising the mold compound, and the MEMS device being embedded in the mold compound of the main embedding part.

5. The packaged MEMS device according to claim 4, wherein the sound port extends through the cover layer and wherein the grille is within a portion of the sound port that extends through the cover layer.

6. The packaged MEMS device according to claim 4, wherein the cover layer comprises a redistribution layer.

7. The packaged MEMS device according to claim 6, wherein the grille is part of the redistribution layer.

8. The packaged MEMS device according to claim 6, wherein the grille is electrically conductive and the redistribution layer is in electrical contact with the grille.

9. The packaged MEMS device according to claim 6, wherein the redistribution layer is configured to provide at least one electrical contact for the MEMS device.

10. The packaged MEMS device according to claim 6, wherein the redistribution layer is configured to provide an electromagnetic interference shielding for at least one of the MEMS device, electrical connections for the MEMS device, and an underlying redistribution layer.

11. The packaged MEMS device according to claim 4, wherein the MEMS device is recessed with respect to a first main surface and an opposite second main surface of the main embedding part.

12. The packaged MEMS device according to claim 1, further comprising:

a further device embedded into the embedding arrangement; and an electrical connection between the MEMS device and the further device.

13. The packaged MEMS device according to claim 1, further comprising a cavity formed within the mold compound of the embedding arrangement adjacent to the MEMS device at an opposite side of the MEMS device than the sound port.

14. The packaged MEMS device according to claim 13, wherein a cross section of the cavity is substantially equal to a surface of the MEMS device.

15. The packaged MEMS device according to claim 1, wherein the MEMS device comprises a substrate-stripped MEMS die.

16. The packaged MEMS device according to claim 1, wherein the sound port includes an opening.

17. The packaged MEMS device according to claim 1, wherein the sound port is adjacent the MEMS device.

18. The packaged MEMS device according to claim 1, wherein the MEMS device comprises a substrate-stripped MEMS part, the substrate-stripped MEMS part comprising the diaphragm and a backplate, wherein the mold compound of the embedding arrangement embraces the diaphragm and the backplate.

19. A packaged MEMS device comprising:

an embedding arrangement comprising a mold compound;

a MEMS device embedded in the mold compound of the embedding arrangement, wherein the MEMS device comprises a diaphragm for sound transduction, and wherein the mold compound braces the diaphragm;

an opening disposed in the embedding arrangement, the opening adjacent to the MEMS device; and a grille within the opening.

20. A packaged MEMS device comprising:

an embedding arrangement comprising a mold compound;

a MEMS device embedded in the mold compound of the embedding arrangement, wherein the MEMS device comprises a diaphragm for sound transduction, and wherein the mold compound braces the diaphragm;

a sound port embedded in the embedding arrangement, the sound port acoustically coupled to the MEMS device; and a grille across the sound port.

21. The packaged MEMS device according to claim 20, wherein the sound port includes an opening, the grille being across the opening.

22. The packaged MEMS device according to claim 20, wherein the sound port is adjacent to the MEMS device.

23. A sound transducer component comprising:

an embedding material having a mold compound;

a substrate-stripped MEMS die embedded into the mold compound of the embedding material, the substrate-stripped MEMS die comprising a diaphragm for sound transduction, wherein the mold compound braces the diaphragm; and a sound port within the embedding material in fluidic contact with the diaphragm.

* * * * *